United States Patent
Tomita et al.

(10) Patent No.: US 12,416,589 B2
(45) Date of Patent: Sep. 16, 2025

(54) SYSTEMS AND METHODS FOR NON-DESTRUCTIVE INSPECTION OF SEMICONDUCTOR DEVICES USING REFLECTIVE X-RAY MICROSCOPE TOMOGRAPHIC IMAGING

(71) Applicant: SANDISK TECHNOLOGIES LLC, Addison, TX (US)

(72) Inventors: Shogo Tomita, Yokkaichi (JP); Tatsuya Hinoue, Yokkaichi (JP); Michiaki Sano, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 687 days.

(21) Appl. No.: 17/808,674

(22) Filed: Jun. 24, 2022

(65) Prior Publication Data

US 2023/0417687 A1    Dec. 28, 2023

(51) Int. Cl.
*G01N 23/18*    (2018.01)
*G01N 23/083*    (2018.01)
(Continued)

(52) U.S. Cl.
CPC .......... *G01N 23/18* (2013.01); *G01N 23/083* (2013.01); *G01N 23/20* (2013.01); *H01L 22/12* (2013.01); *G01N 2223/401* (2013.01); *G01N 2223/6116* (2013.01); *G01N 2223/646* (2013.01); *H10B 41/27* (2023.02); *H10B 43/27* (2023.02)

(58) Field of Classification Search
None
See application file for complete search history.

(56) References Cited

U.S. PATENT DOCUMENTS 5,114,236 A * 5/1992 Matsugu ............... G03F 9/7076
250/548
2002/0161534 A1  10/2002 Adler et al.
(Continued)

OTHER PUBLICATIONS

Chao, W. et al., "Demonstration of 12 nm Resolution Fresnel Zone Plate Lens based Soft X-ray Microscopy," Optics Express 17669, vol. 17, No. 20, (2009).
(Continued)

*Primary Examiner* — Hoon K Song
(74) *Attorney, Agent, or Firm* — THE MARBURY LAW GROUP PLLC

(57) ABSTRACT

Systems and methods for non-destructive inspection of semiconductor devices, such as three-dimensional NAND memory device, using reflective X-ray microscope computed tomographic (CT) imaging. An X-ray microscope directs a focused beam of X-ray radiation at an oblique angle onto the surface of a semiconductor wafer such that the beam passes through device structures and at least a portion of the beam is reflected by a semiconductor substrate of the wafer and detected by an X-ray detector. The wafer may be rotated about a rotation axis to obtain X-ray images of a region-of-interest (ROI) at different projection angles. A processing unit uses detected X-ray image data obtained by the X-ray detector at the different projection angles to generate a CT reconstructed image of the ROI. The CT reconstructed image may enable inspection of internal structural features, including embedded defects, in the semiconductor device in a non-destructive manner.

2 Claims, 27 Drawing Sheets

(51) Int. Cl.
  *G01N 23/20* (2018.01)
  *H01L 21/66* (2006.01)
  *H10B 41/27* (2023.01)
  *H10B 43/27* (2023.01)

(56) References Cited

U.S. PATENT DOCUMENTS

| | | | |
|---|---|---|---|
| 2003/0047682 A1 | 3/2003 | Hatakeyama et al. | |
| 2004/0057107 A1 | 3/2004 | Yun et al. | |
| 2004/0144301 A1 | 7/2004 | Neudeck et al. | |
| 2004/0175631 A1 | 9/2004 | Crocker et al. | |
| 2008/0273662 A1* | 11/2008 | Yun | G03F 7/70625 378/74 |
| 2013/0039471 A1* | 2/2013 | Wormington | G01N 23/20 378/81 |
| 2015/0228448 A1 | 8/2015 | Adderly et al. | |
| 2015/0262892 A1 | 9/2015 | Sugimoto et al. | |
| 2015/0270023 A1 | 9/2015 | Adler | |
| 2015/0348750 A1 | 12/2015 | Obara et al. | |
| 2017/0117195 A1 | 4/2017 | Adderly et al. | |
| 2018/0136145 A1 | 5/2018 | Bryant et al. | |
| 2019/0004190 A1 | 1/2019 | Cao et al. | |
| 2019/0096950 A1 | 3/2019 | Cao et al. | |
| 2019/0187077 A1 | 6/2019 | Lee et al. | |
| 2019/0279840 A1 | 9/2019 | Teo et al. | |
| 2019/0312111 A1 | 10/2019 | Nagao et al. | |
| 2020/0013919 A1 | 1/2020 | Cao et al. | |
| 2021/0013362 A1 | 1/2021 | Cao et al. | |
| 2021/0285898 A1* | 9/2021 | Dikopoltsev | G01T 1/166 |
| 2021/0334946 A1 | 10/2021 | Buzaglo | |

OTHER PUBLICATIONS

Endoh et al., "Novel Ultra High-Density Memory with a Stacked-Surrounding Gate Transistor (S-SGT) Structured Cell," IEDM Proc. (2001) 33-36.

Holler, M. et al., "Three-dimensional imaging of integrated circuits with macro- to nanoscale zoom," Nature Electronics, vol. 2, pp. 464-470, (2019).

Momose, A. et al., "Recent Progress in X-Ray and Neutron Phase Imaging with Gratings," Quantum Beam Sci., vol. 4, No. 9, pp. 1-21, (2020); doi:10.3390/qubs4010009.

Momose, A. et al., "X-ray Phase Imaging by Two-Beam Interferometry with Full-Field X-ray Microscope and Transmission Grating," Microsc. Microanal., vol. 24 (Suppl 2), pp. 218-219, 2018; doi:10.1017/S1431927618013442.

Takeda, Y. et al., "Differential Phase X-ray Imaging Microscopy with X-ray Talbot Interferometer," Applied Physics Express, vol. 1 (2008) 117002.

* cited by examiner

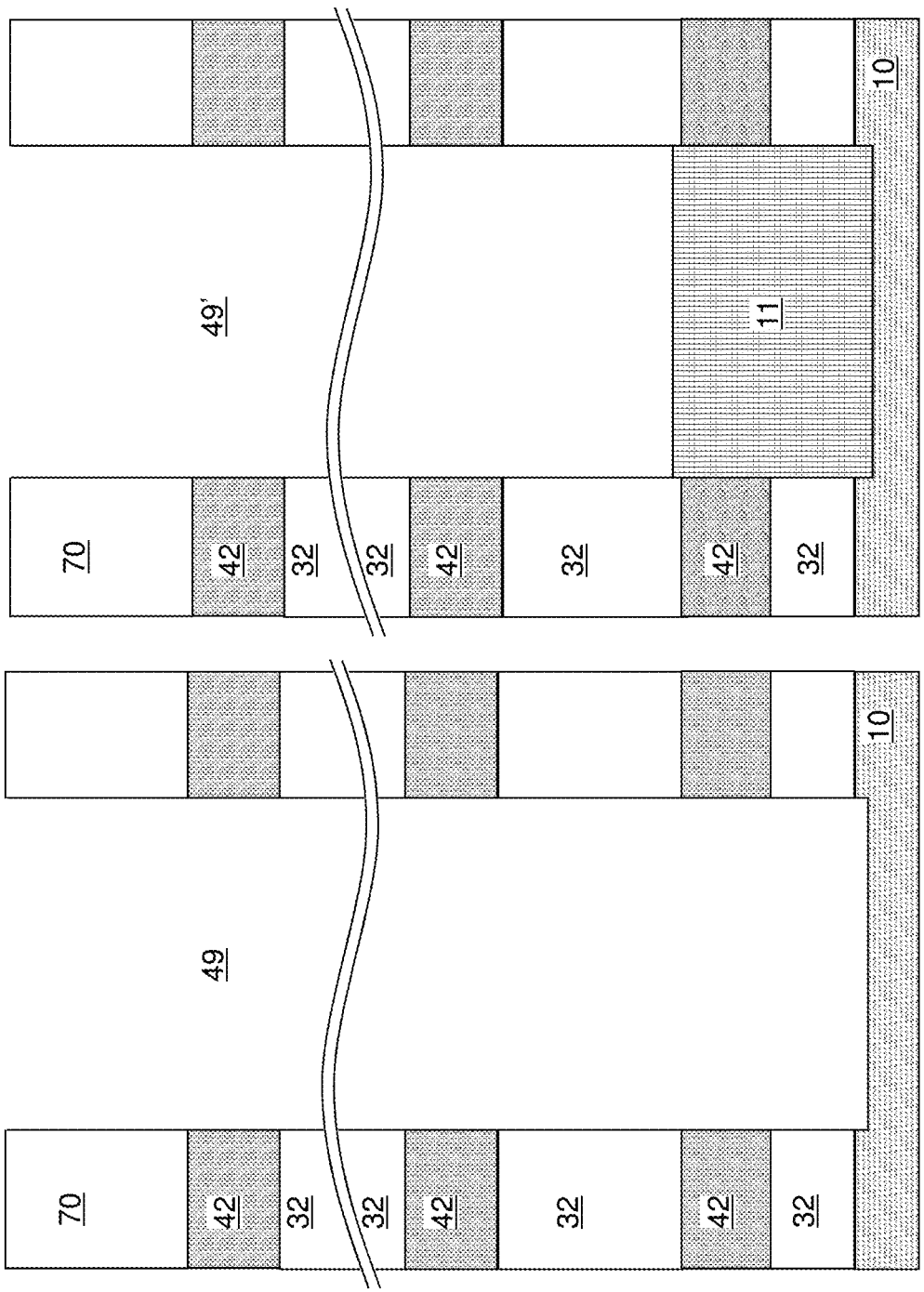

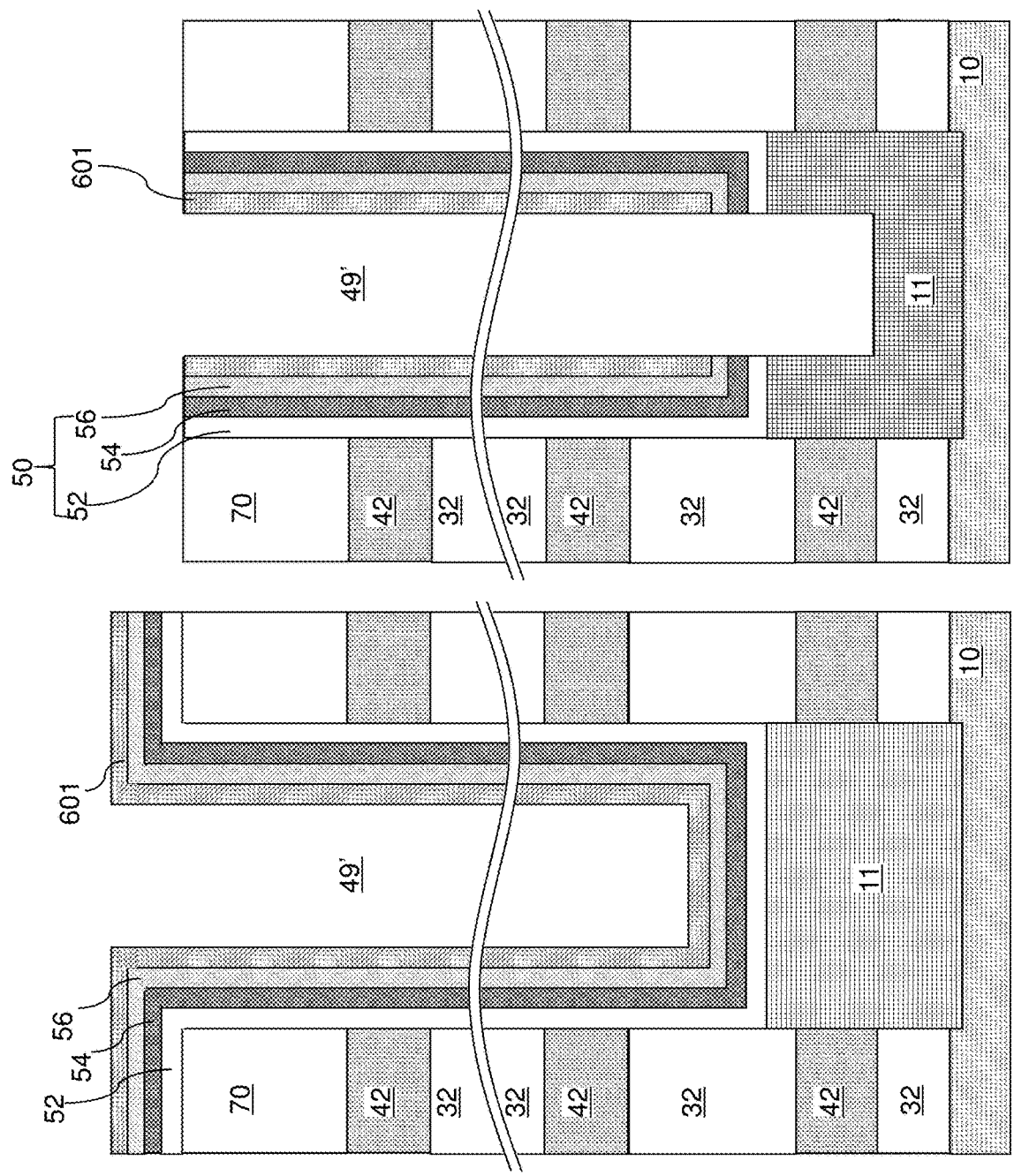

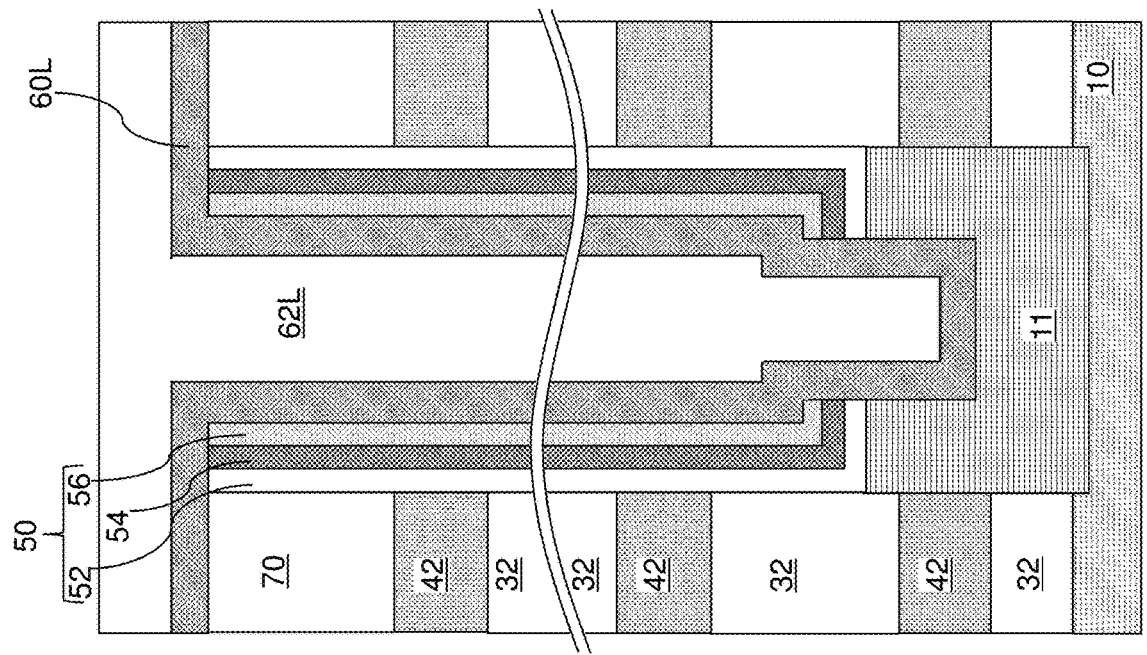
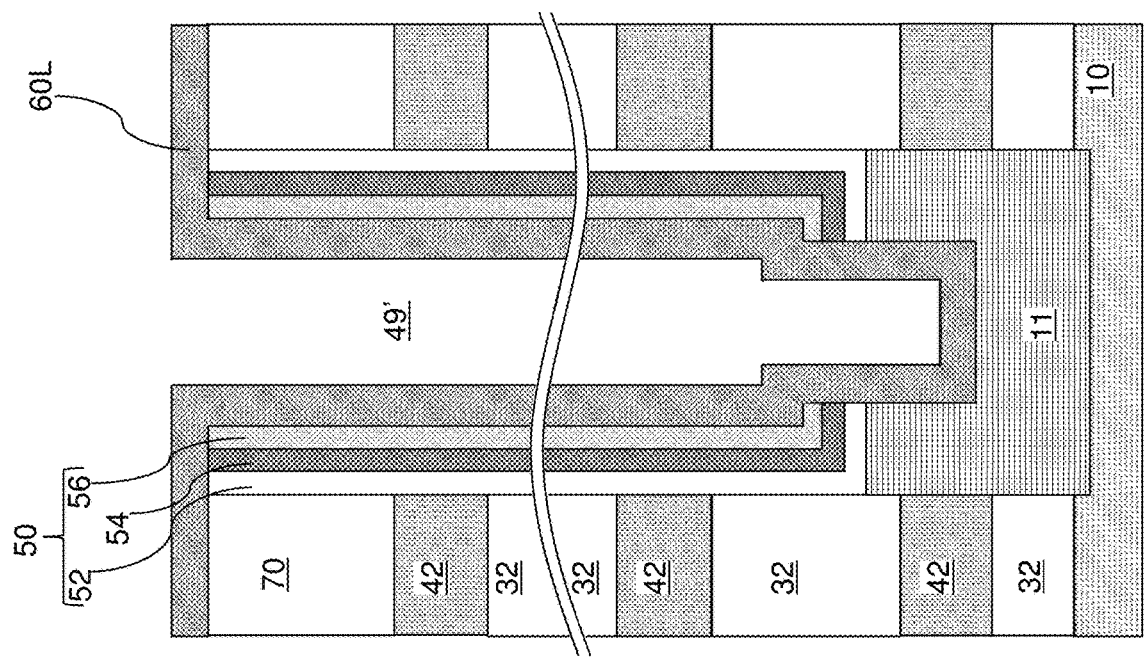

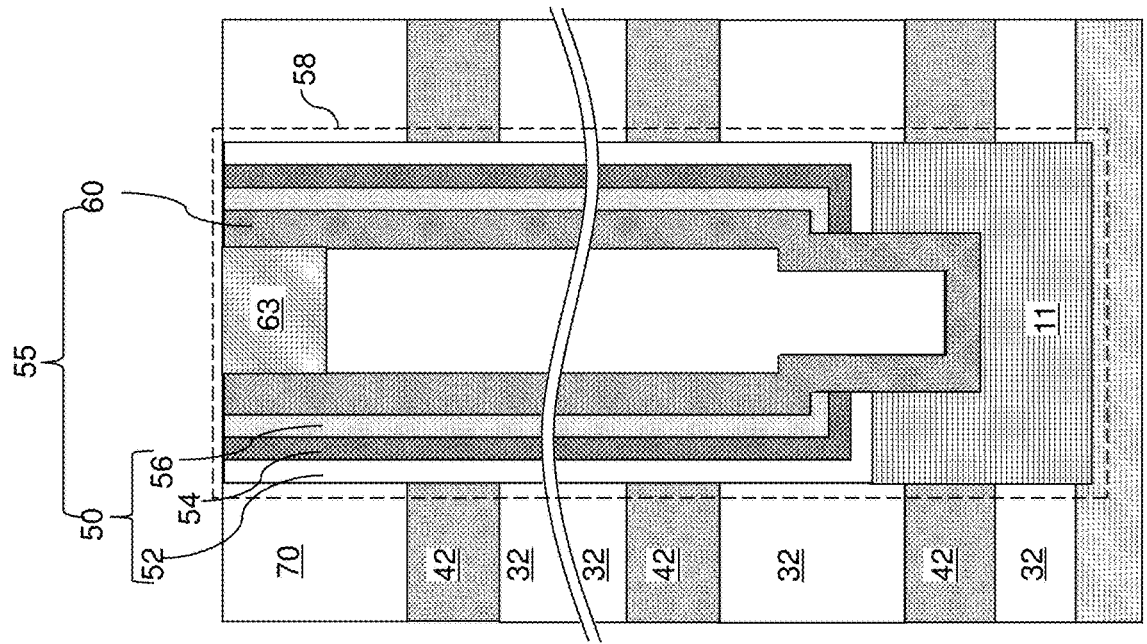
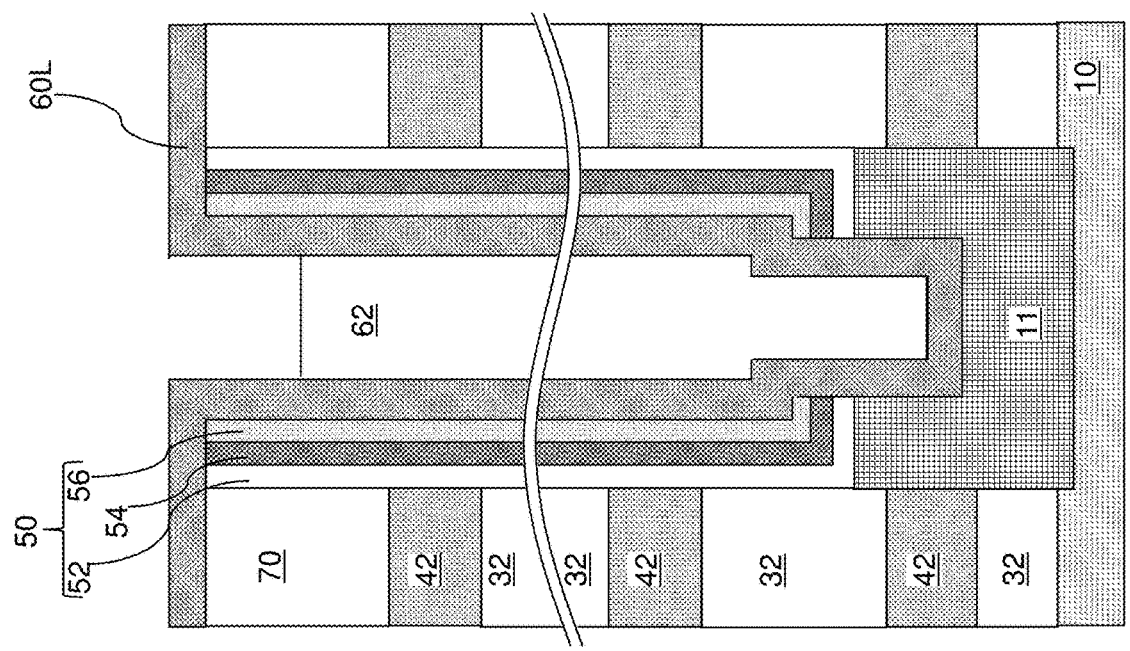
FIG. 5H
FIG. 5G

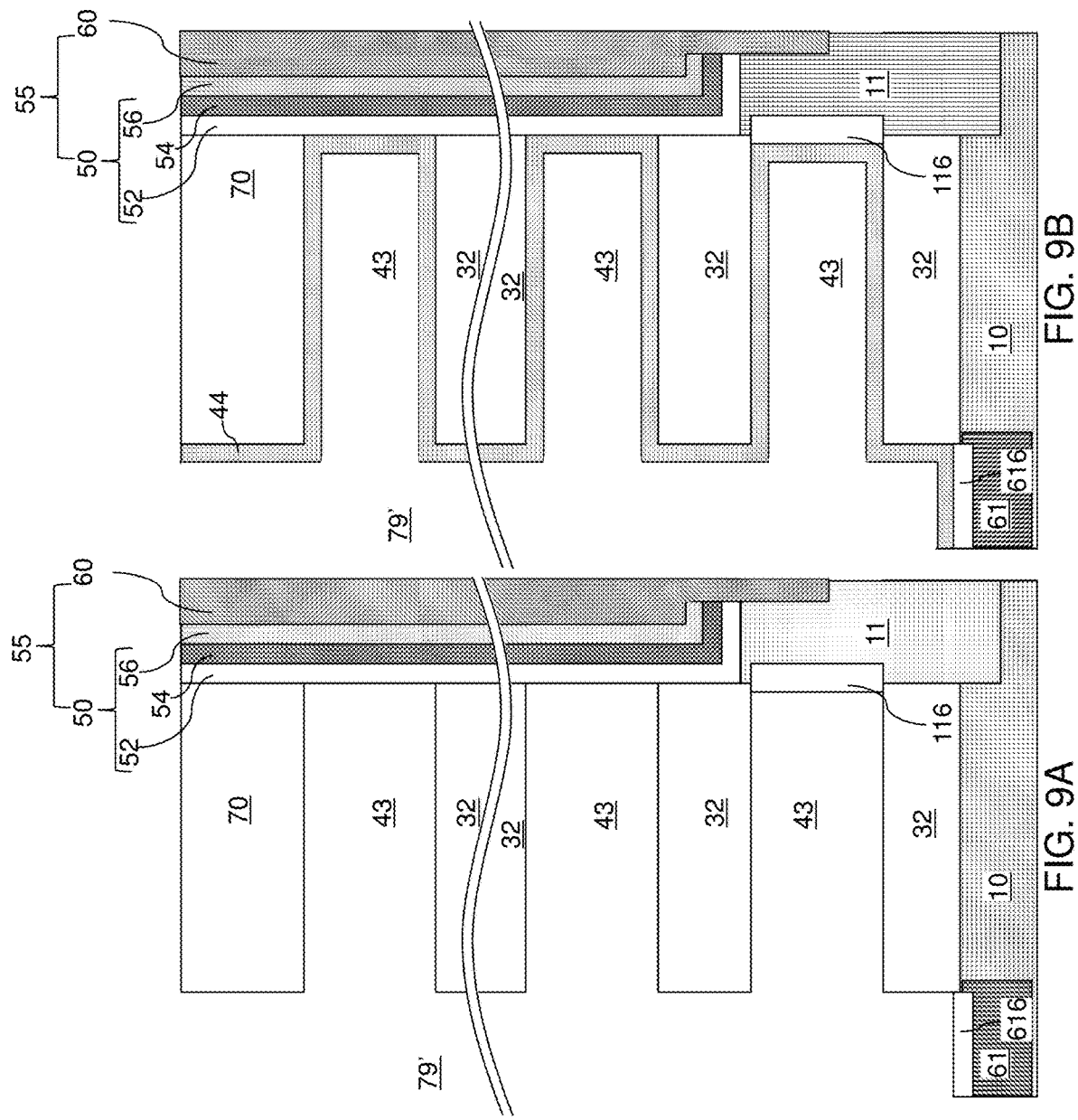

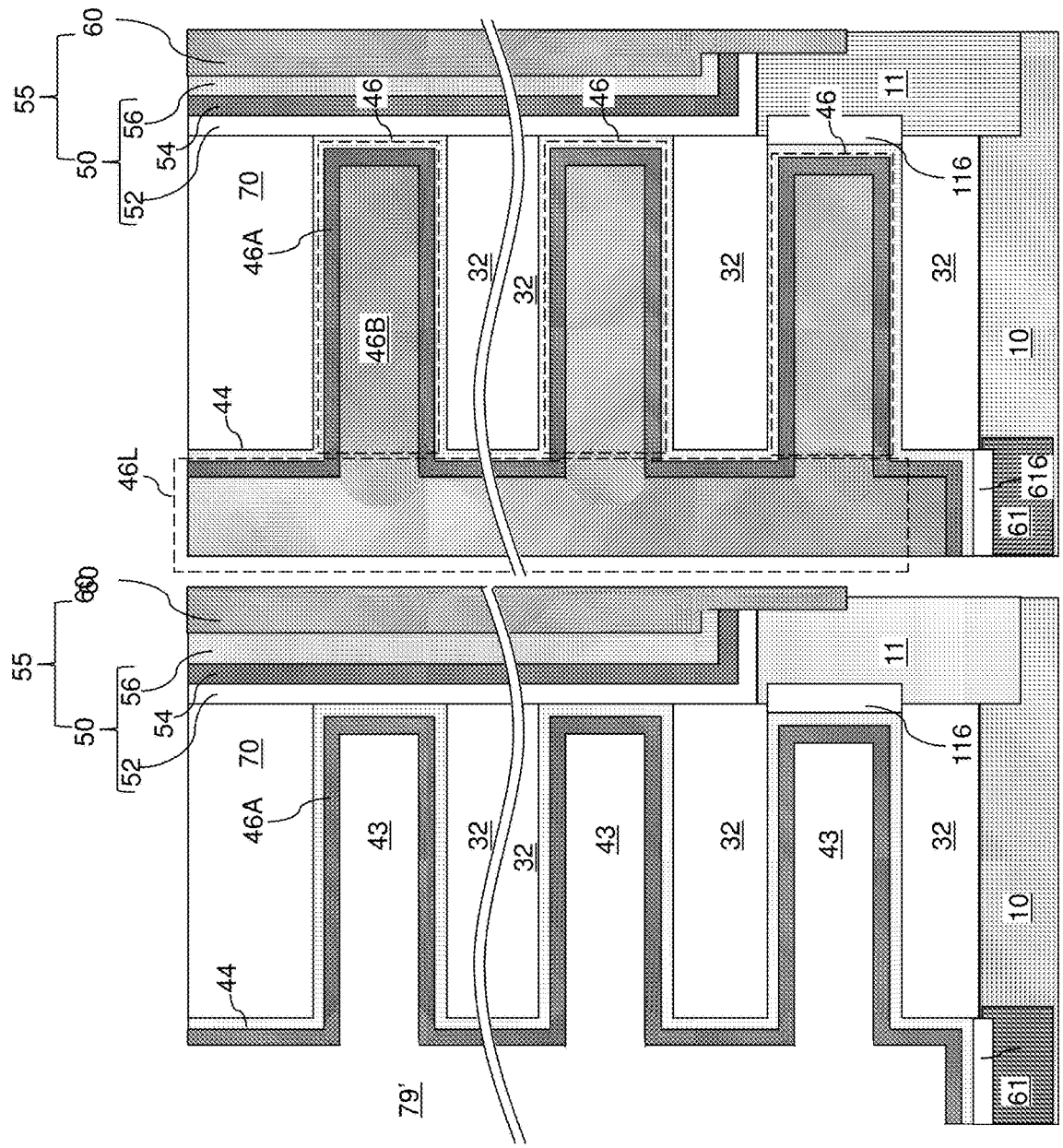

SYSTEMS AND METHODS FOR NON-DESTRUCTIVE INSPECTION OF SEMICONDUCTOR DEVICES USING REFLECTIVE X-RAY MICROSCOPE TOMOGRAPHIC IMAGING

FIELD

The present disclosure relates generally to the field of semiconductor devices, and particularly to systems and methods for non-destructive inspection of semiconductor devices using reflective X-ray microscope computed tomographic (CT) imaging.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a system for non-destructive inspection of semiconductor devices includes an X-ray source configured to direct a beam of X-ray radiation at an oblique angle onto a surface of a semiconductor wafer such that the beam of X-ray radiation passes through device structures located over a semiconductor substrate of the semiconductor wafer, and at least a portion of the beam of X-ray radiation is reflected by the semiconductor substrate of the semiconductor wafer, an X-ray detector configured to detect X-ray radiation that is attenuated by the device structures and reflected by the semiconductor substrate of the semiconductor wafer, a wafer stage apparatus configured to rotate the semiconductor wafer with respect to a rotation axis such that the X-ray detector detects X-ray radiation that is attenuated by the device structures and reflected by the semiconductor substrate of the semiconductor wafer over a plurality of different projection angles, and a processing unit coupled to the X-ray detector and configured to receive X-ray image data from the X-ray detector for each projection angle of the plurality of different projection angles and to generate a reconstructed image of the device structures of the semiconductor wafer.

According to another aspect of the present disclosure, a method non-destructive inspection of semiconductor device structures includes providing a semiconductor wafer comprising a semiconductor material substrate and device structures over the semiconductor material substrate, directing a beam of X-ray radiation at an oblique angle onto a surface of the semiconductor wafer such that the beam of X-ray radiation passes through the device structures, and at least a portion of the beam of X-ray radiation is reflected by the semiconductor substrate of the semiconductor wafer, detecting X-ray radiation that is attenuated by the device structures and reflected by the semiconductor substrate of the semiconductor wafer, rotating the semiconductor wafer with respect to the beam of X-ray radiation such that the X-ray detector detects X-ray radiation that is attenuated by the device structures and reflected by the semiconductor substrate of the semiconductor wafer at a plurality of different projection angles, and generating a reconstructed image of the device structures using image data from the X-ray detector obtained at each projection angle of the plurality of different projection angles.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

DETAILED DESCRIPTION

Figure 1:
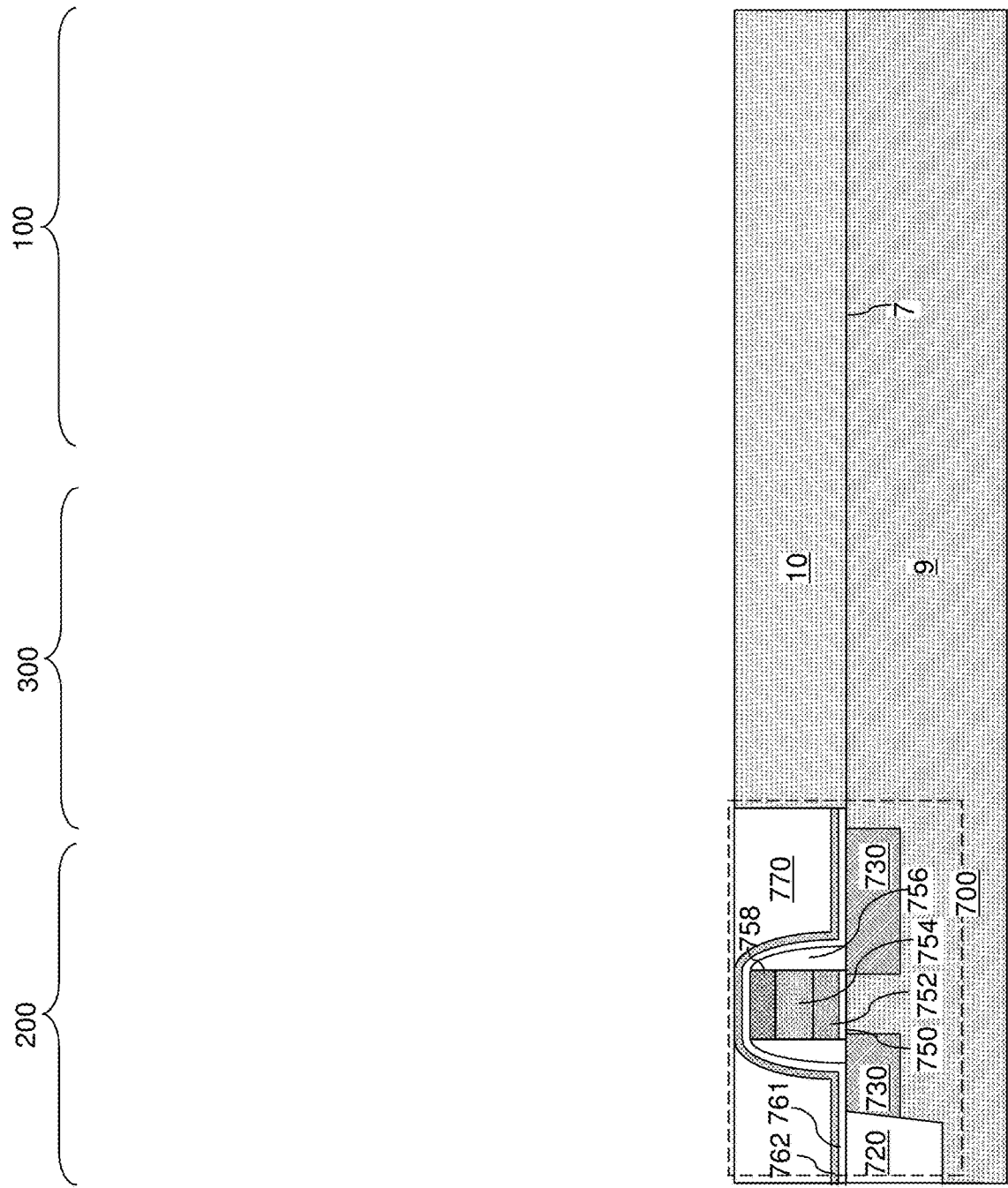
FIG. 1 is a schematic vertical cross-sectional view of an exemplary structure after formation of at least one peripheral device, a semiconductor material layer, and a gate dielectric layer according to an embodiment of the present disclosure.

As discussed above, the embodiments of the present disclosure are directed to the field of semiconductor devices, and particularly to systems and methods for non-destructive inspection of semiconductor devices using reflective X-ray microscope computed tomographic (CT) imaging. The embodiments of the disclosure can be employed for non-destructive inspection of various semiconductor device structures including a multilevel memory structure, non-limiting examples of which include three-dimensional memory array devices comprising a plurality of NAND memory strings. The embodiments of the disclosure may be used for quality control of manufactured and/or in-progress semiconductor devices, and may be used to identify defects, including embedded defects, in the semiconductor device structure.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

A non-limiting example of a semiconductor device that may be inspected using the embodiments of the present disclosure is illustrated in FIGS. 1-13, which are sequential drawings illustrating a process of fabricating a three-dimensional NAND memory device. While a three-dimensional NAND memory device is illustrated in FIGS. 1-13, the devices that may be inspected using the embodiments of the present disclosure include any other memory devices, such as two-dimensional NAND memory devices, NOR memory devices, SRAM's, DRAM's, ReRAM memory devices, or magnetoresistive random access memory (MRAM) devices, logic devices, such as a processor devices, sensor devices, etc.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In this embodiment, a horizontal source line (e.g., a direct strap contact) may be formed over an insulating layer located over the substrate 9. The horizontal source line may comprise a heavily doped semiconductor layer or layers, such as heavily doped polysilicon, which contacts a sidewall of a vertical semiconductor channel, as will be described in more detail below. In another alternative embodiment, the peripheral device region 200 may be located on a separate substrate which is subsequently bonded to the memory array region 100.

Figure 2:
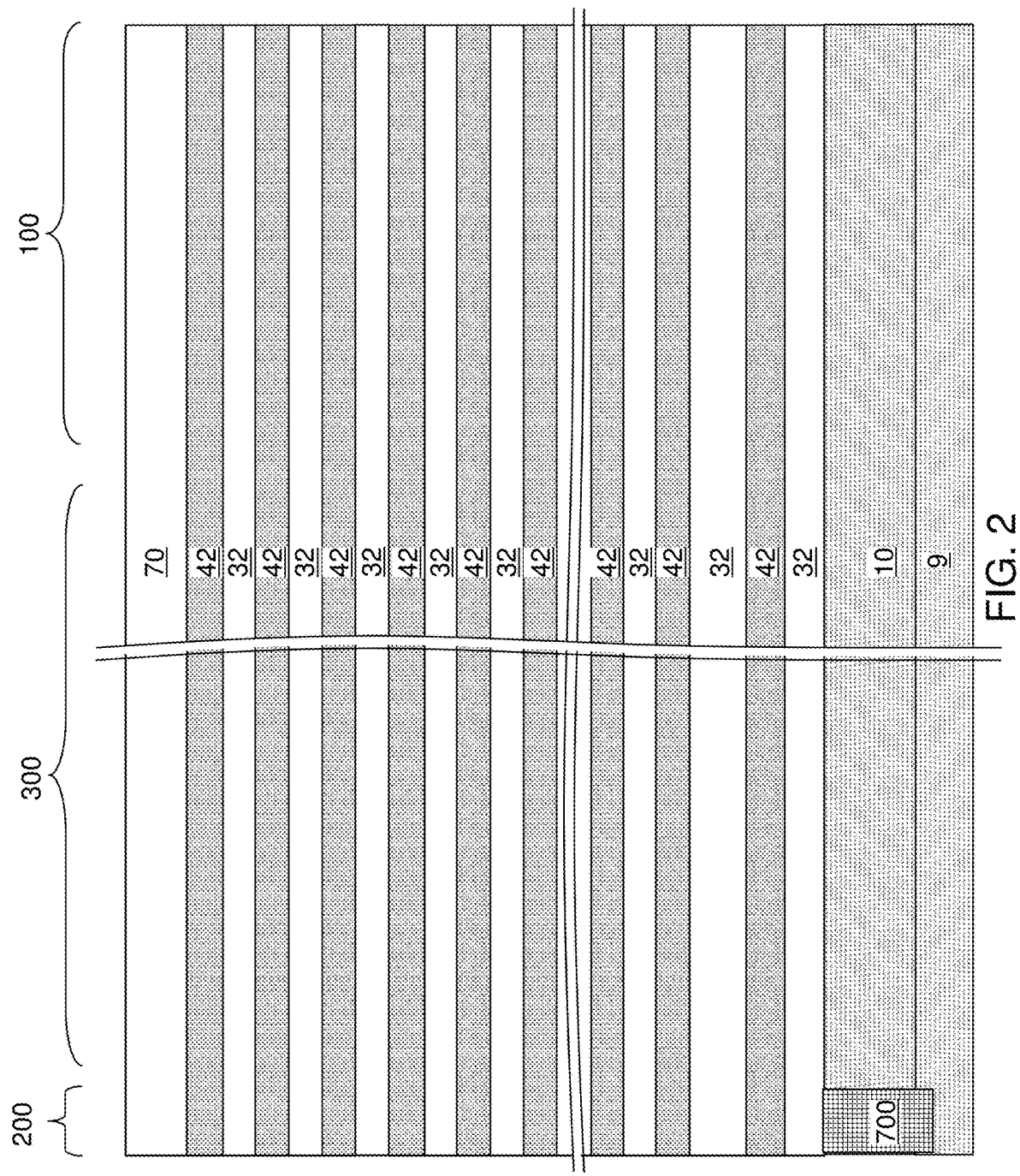
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While an embodiment is described in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
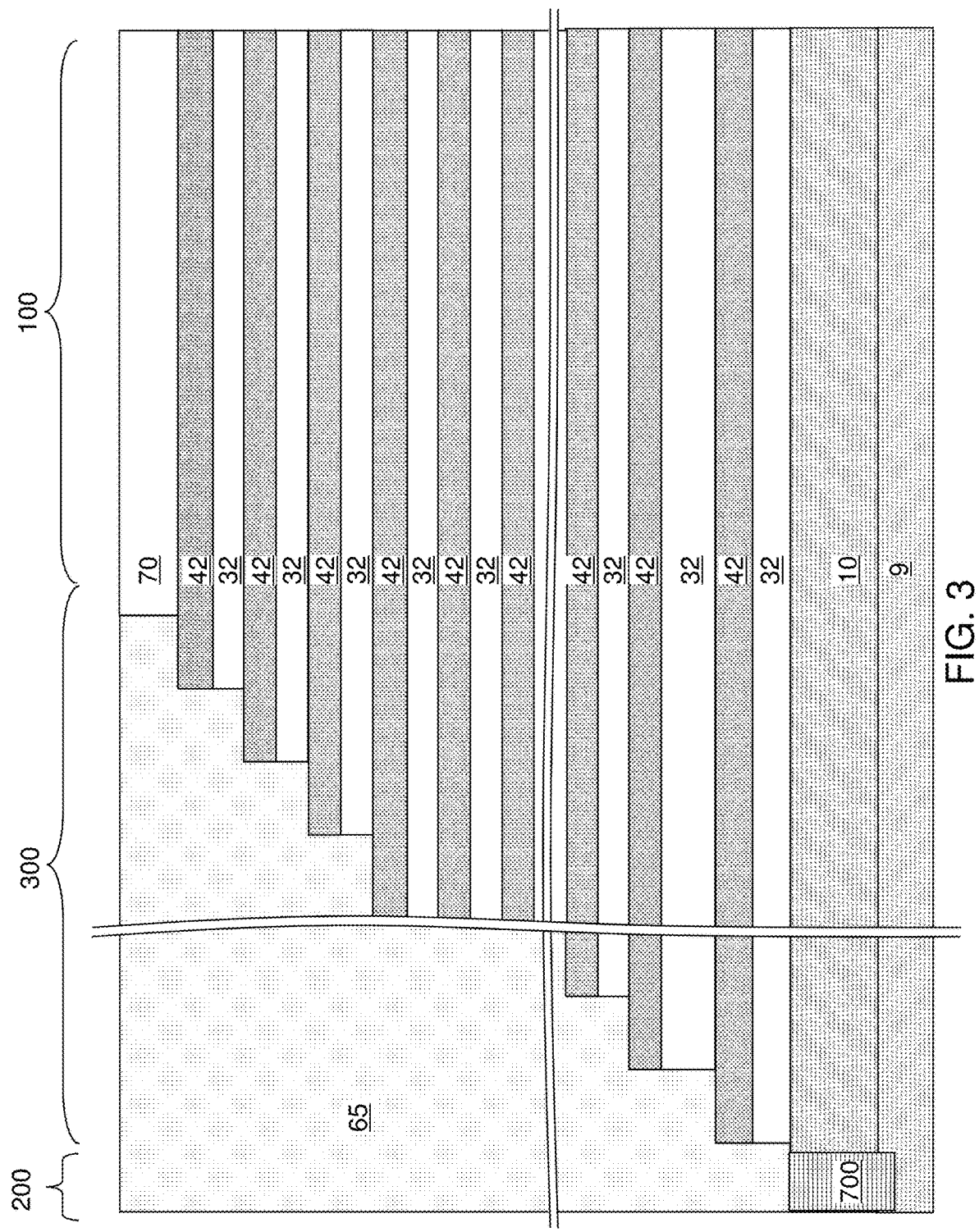
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion may, or may not, be doped with dopants such as B, P, and/or F.

Optionally, drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
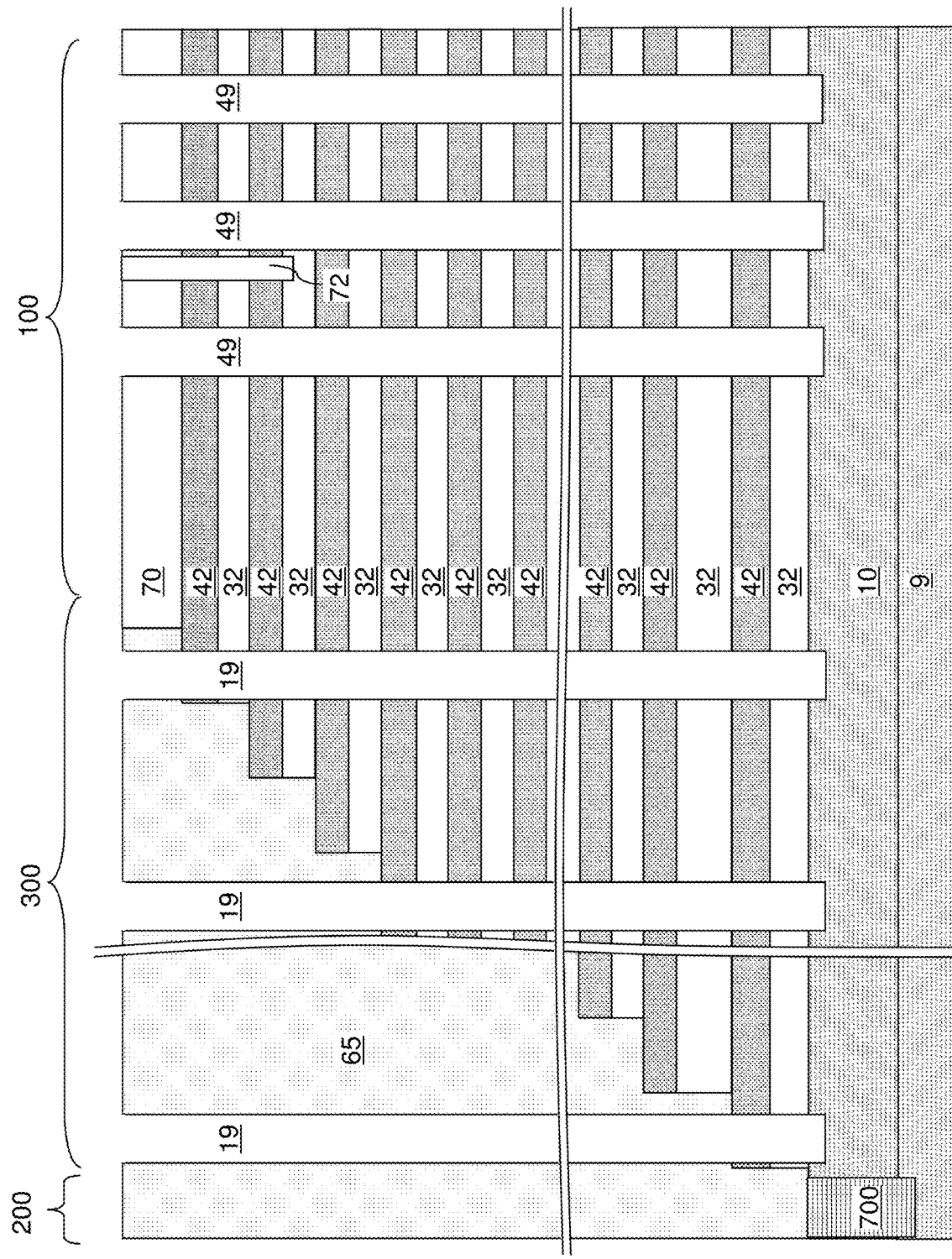
FIG. 4A is a schematic vertical cross-sectional view of the exemplary structure after formation of memory openings and support openings according to an embodiment of the present disclosure.
Figure 4B:
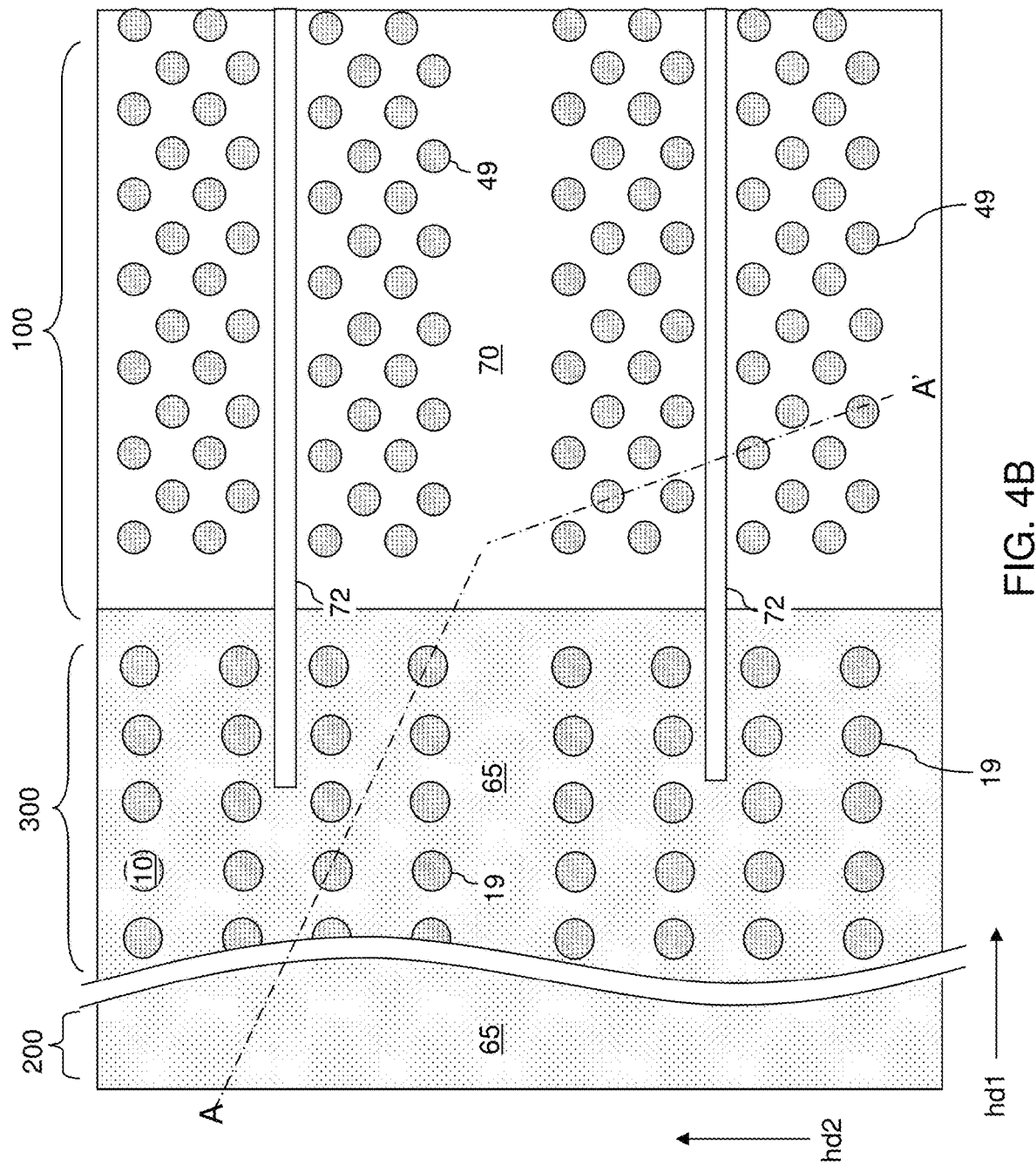
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a memory material layer 54, a tunneling dielectric layer 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the tunneling dielectric layer 56, the memory material layer 54, the blocking dielectric layer 52 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the tunneling dielectric layer 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the memory material layer 54. A set of a blocking dielectric layer 52, a memory material layer 54, and a tunneling dielectric layer 56 in a memory opening 49 constitutes a memory film 50, which includes a plurality of charge storage regions (comprising portions of the memory material layer 54) that are insulated from surrounding materials by the blocking dielectric layer 52 and the tunneling dielectric layer 56. In one embodiment, the sacrificial cover material layer 601, the tunneling dielectric layer 56, the memory material layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}$/cm$^3$ to $2.0 \times 10^{21}$/cm$^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
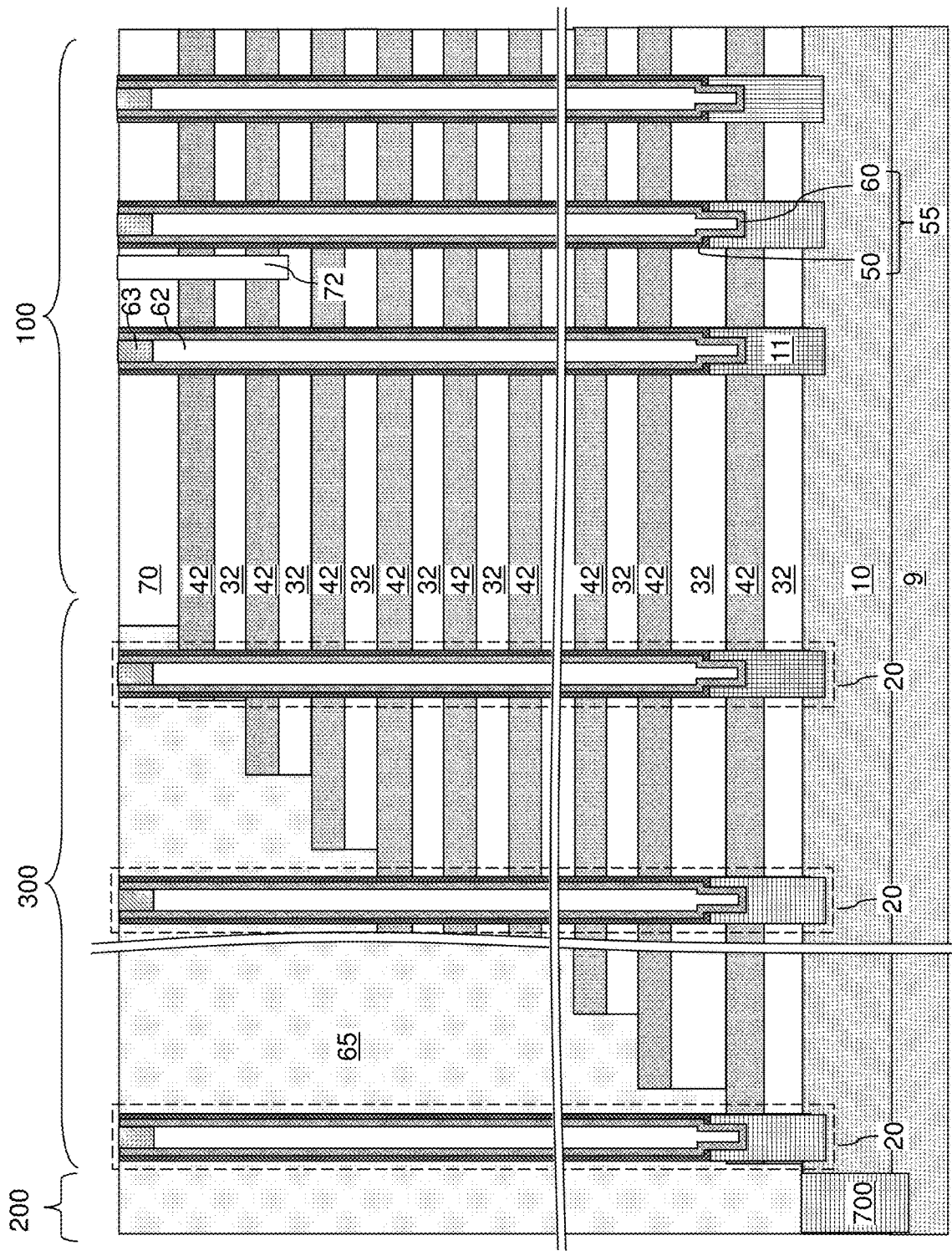
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions or ferroelectric regions (e.g., comprising portions of the memory material layer 54) laterally surrounding the tunneling dielectric layer 56 (if present in combination with the charge storage regions) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
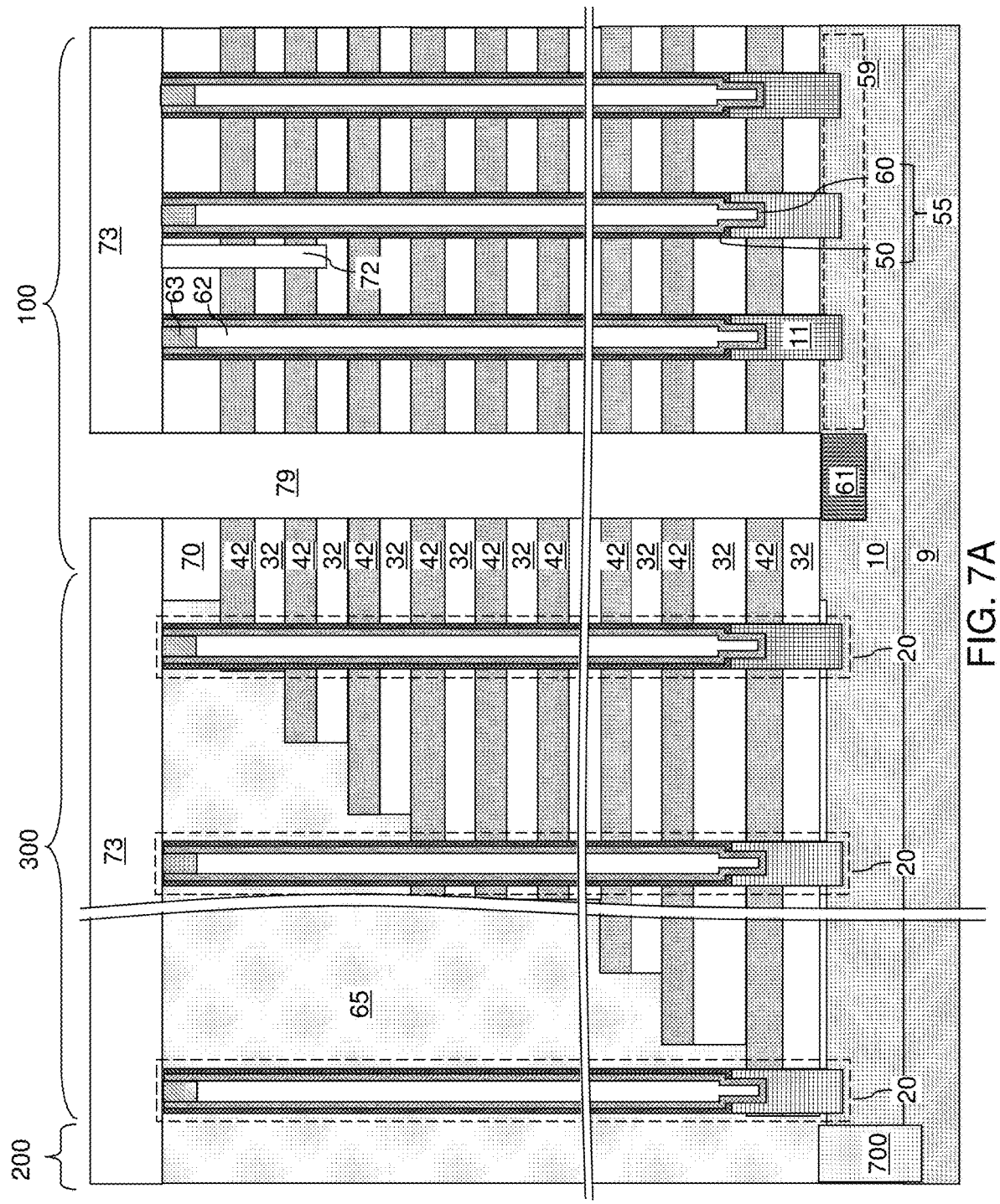
FIG. 7A is a schematic vertical cross-sectional view of the exemplary structure after formation of backside trenches and source regions according to an embodiment of the present disclosure.
Figure 7B:
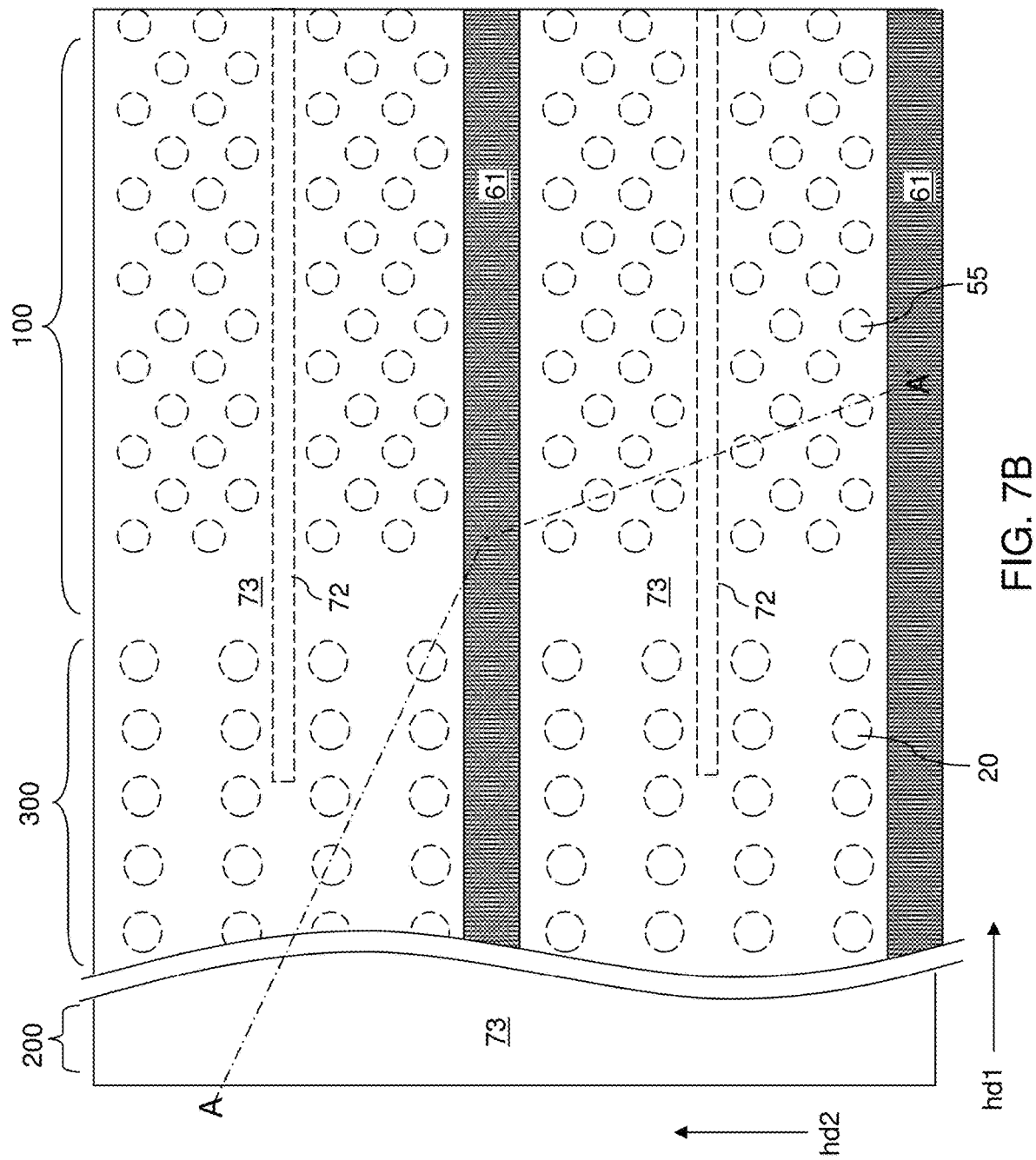
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart among one another along a second horizontal direction (e.g., bit line direction) hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing. Generally, backside trenches 79 laterally extending along the first horizontal direction hd1 can be formed through the contact-level dielectric layer 73 and the alternating stack (32, 42). The alternating stack (32, 42) as formed at the processing steps of FIG. 3 is divided into multiple alternating stacks (32, 42) that are laterally spaced apart along the second horizontal direction hd2 by the backside trenches 79. Layer stacks (32, 42, 70, 73) are formed, each of which includes a respective patterned portion of the contact-level dielectric layer 73 and a respective patterned portion of the alternating stack (32, 42) as formed at the processing steps of FIG. 3 and laterally spaced from each other by the backside trenches 79.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8:
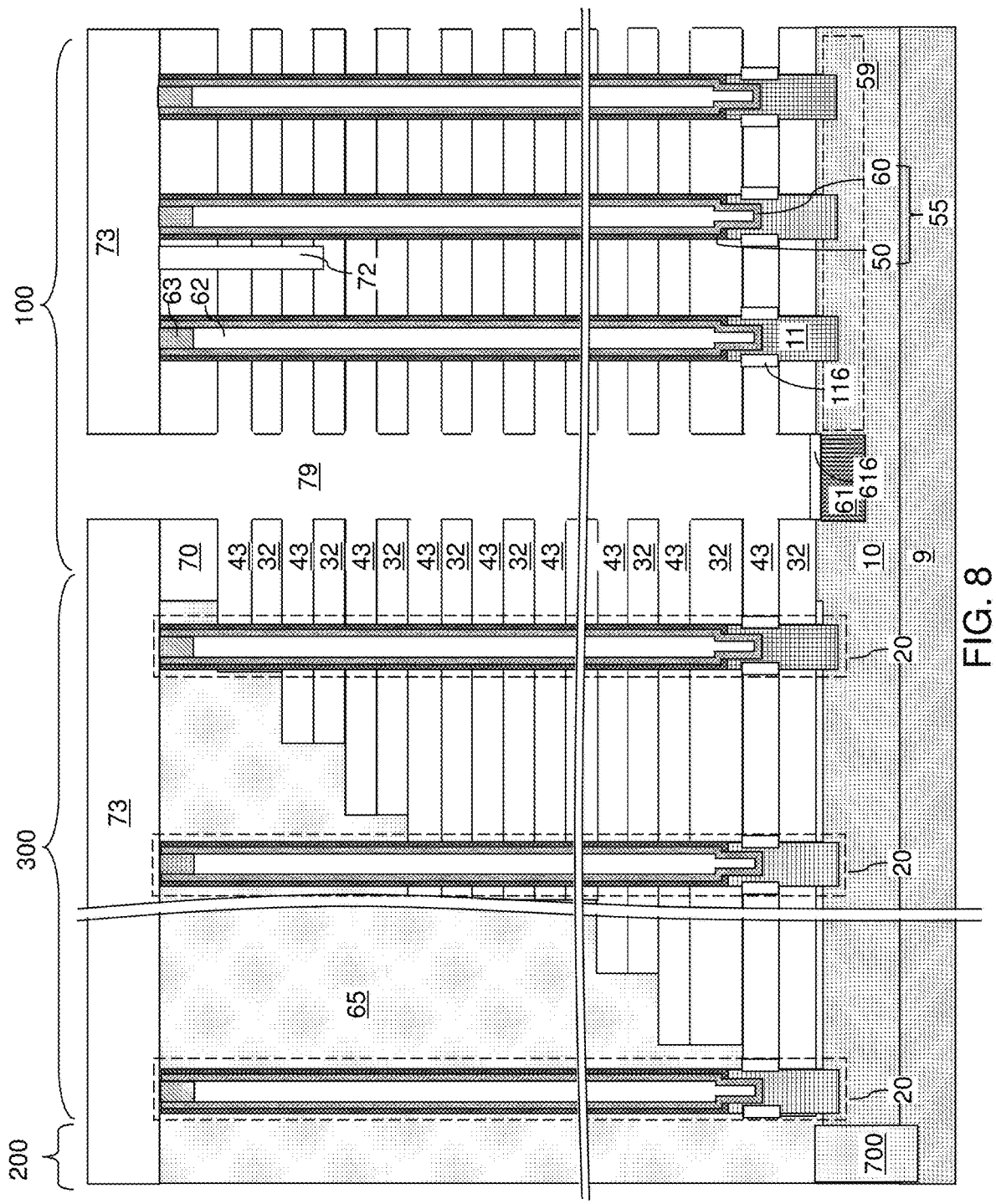
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside cavities 79', for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Generally, the backside recesses 43 can be formed by removing the sacrificial material layers 42 (which are patterned portions of the sacrificial material layers as formed at the processing steps of FIG. 3) selective to the insulating layers 32 (which are patterned portions of the insulating layers 32 as formed at the processing steps of FIG. 3).

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, at least one conductive material can be deposited in the backside recesses 43 by providing at least one reactant gas into the backside recesses 43 through the backside trenches 79. A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
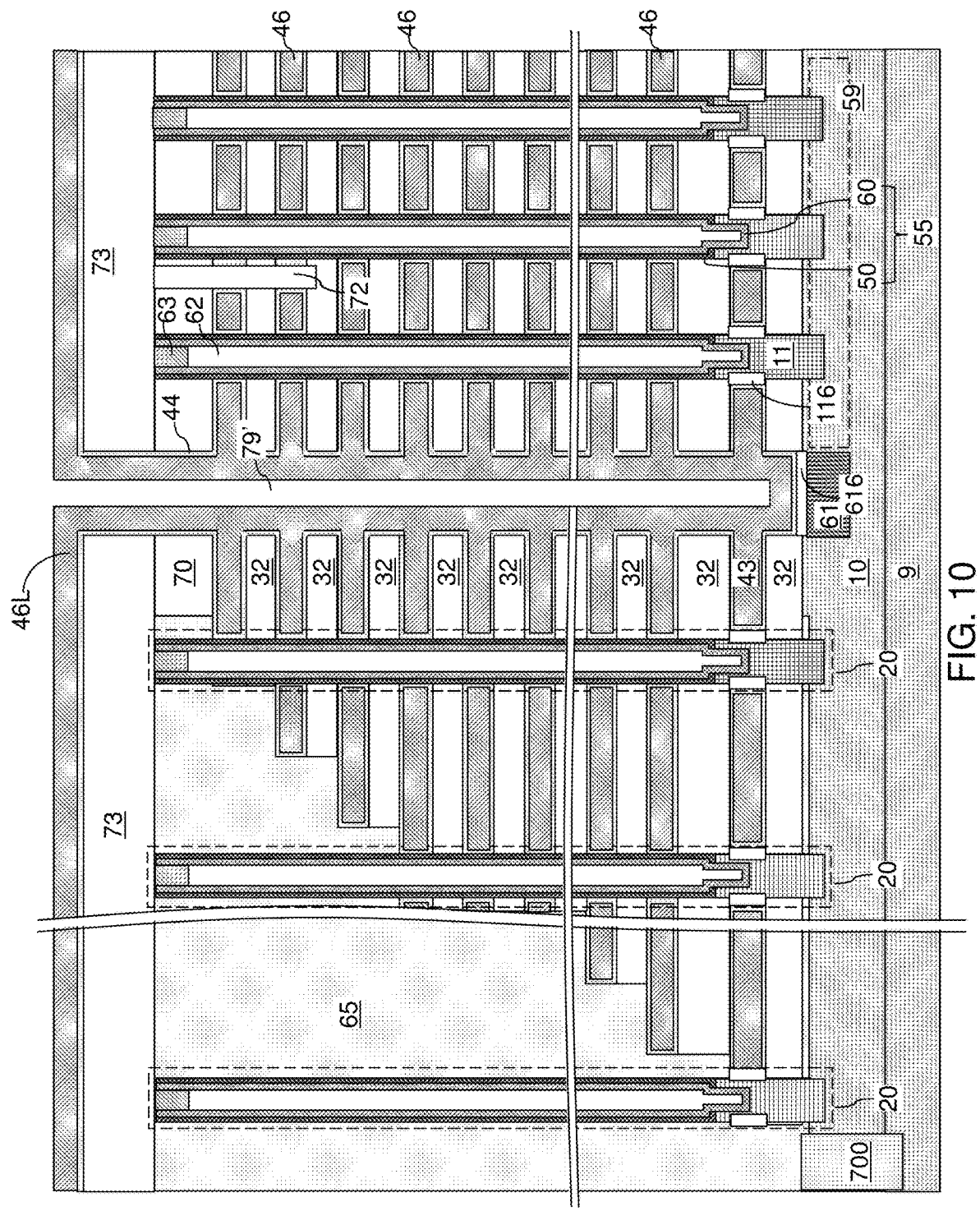
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
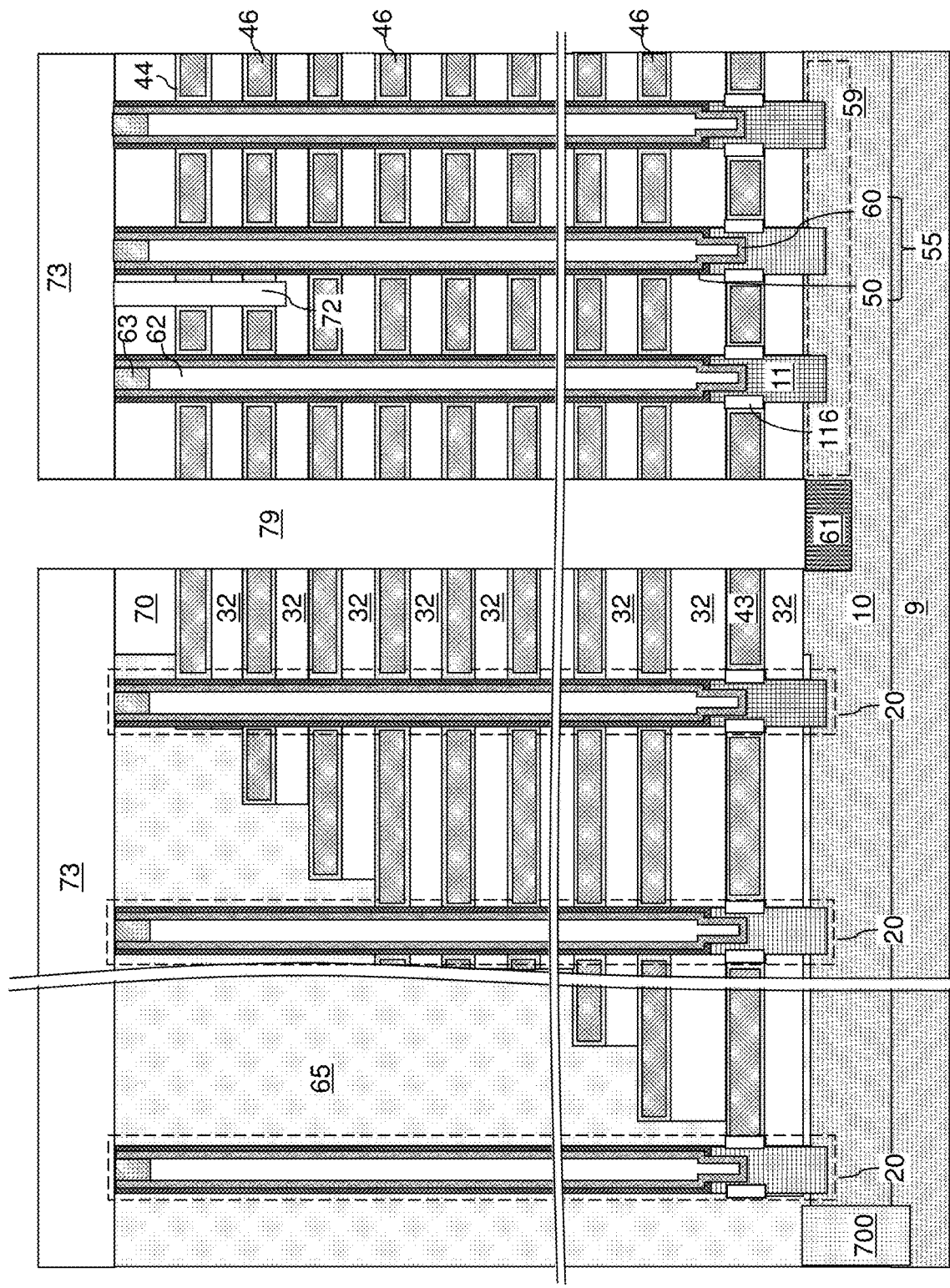
FIG. 11A is a schematic vertical cross-sectional view of the exemplary structure after removal of conductive materials from within the backside trenches according to an embodiment of the present disclosure.
Figure 11B:
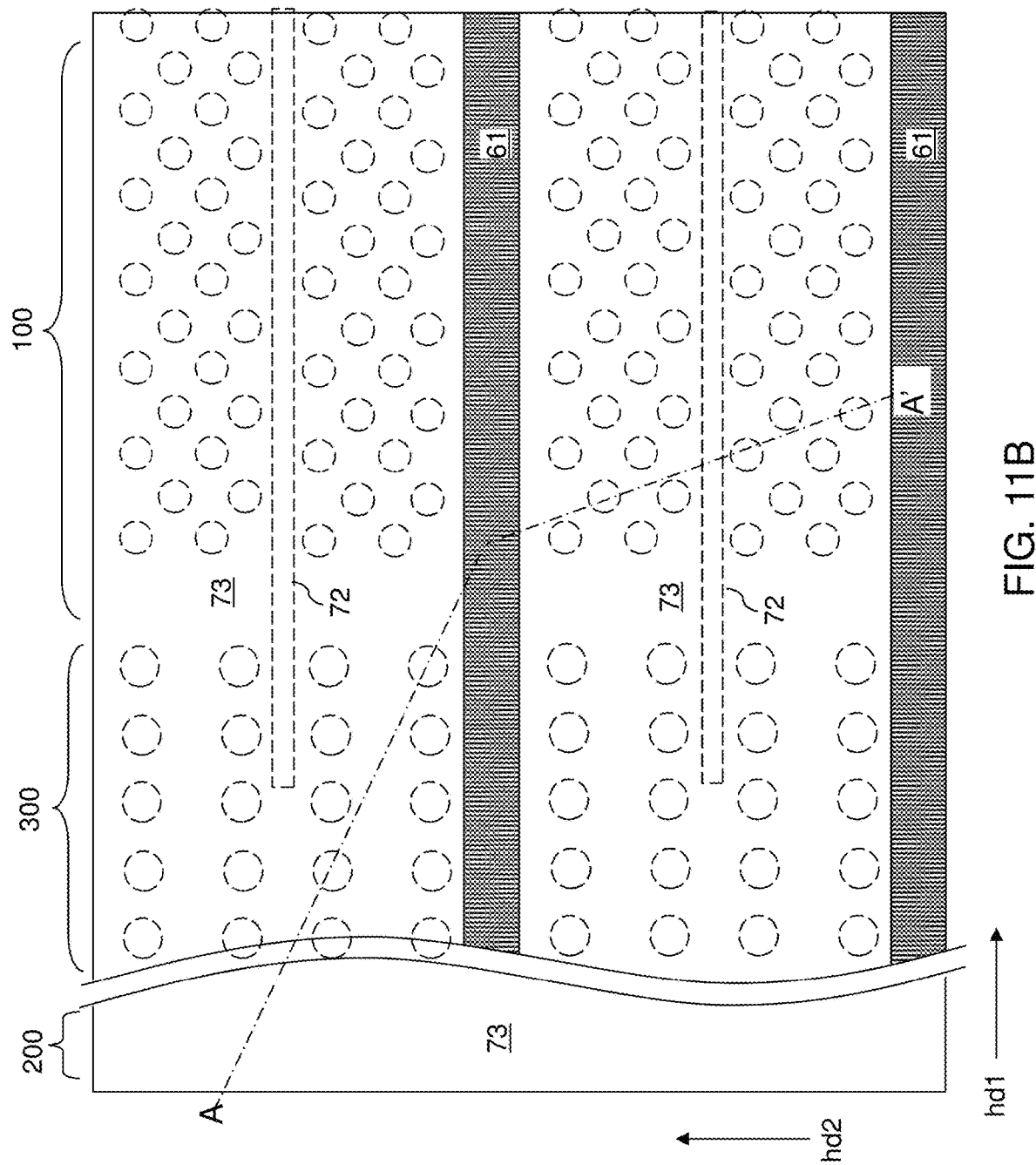
FIG. 11B is a partial see-through top-down view of the exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive material layer 46L is etched back from the sidewalls of each backside trench 79 and from above the contact-level dielectric layer 73 by performing an isotropic etch process that etches the at least one conductive material of the continuous electrically conductive material layer 46L. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. Each backside cavity 79' continuous extends along the first horizontal direction hd1.

Figure 12A:
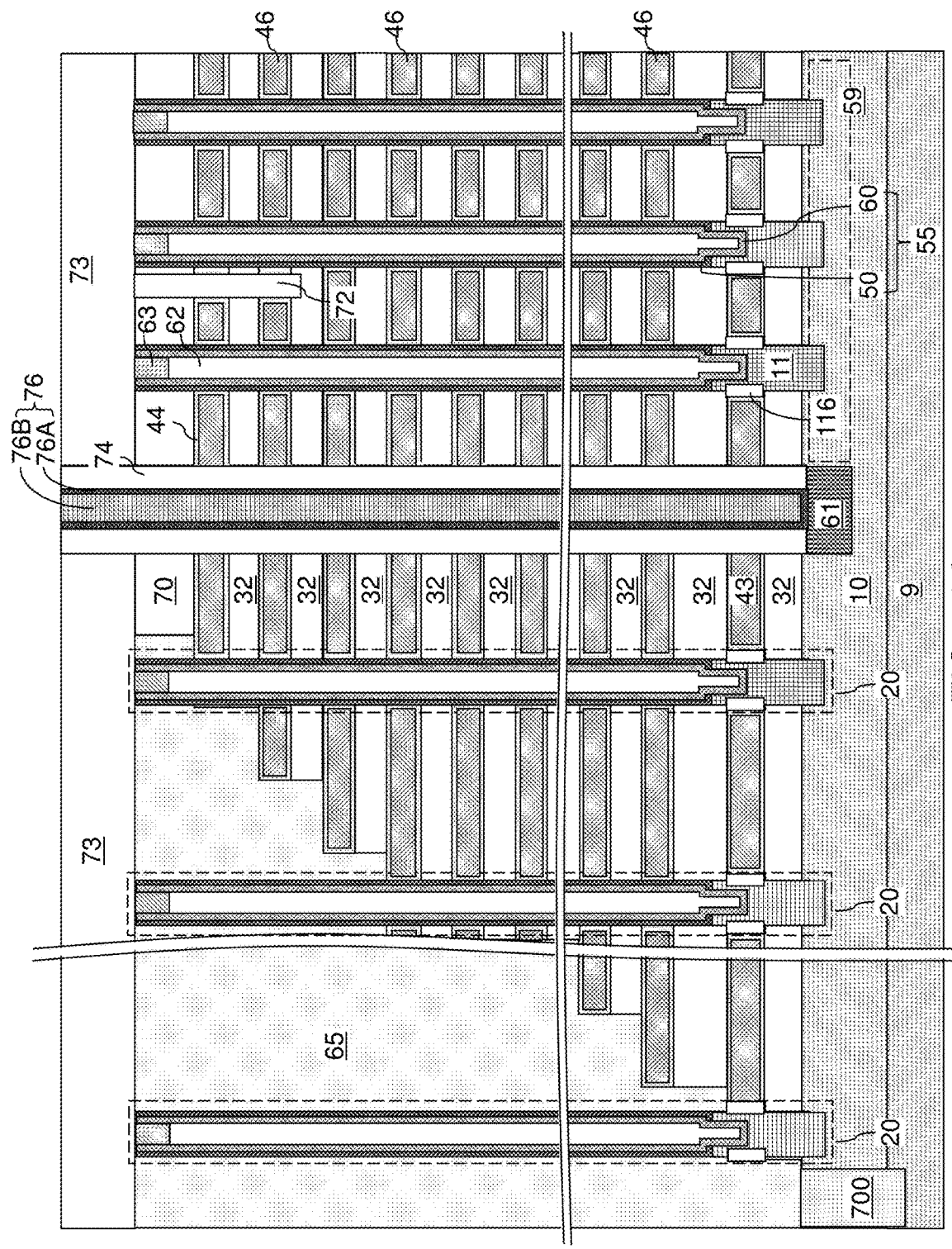
FIG. 12A is a schematic vertical cross-sectional view of the exemplary structure after formation of an insulating spacer and a backside contact via structure within each backside trench according to an embodiment of the present disclosure.
Figure 12B:
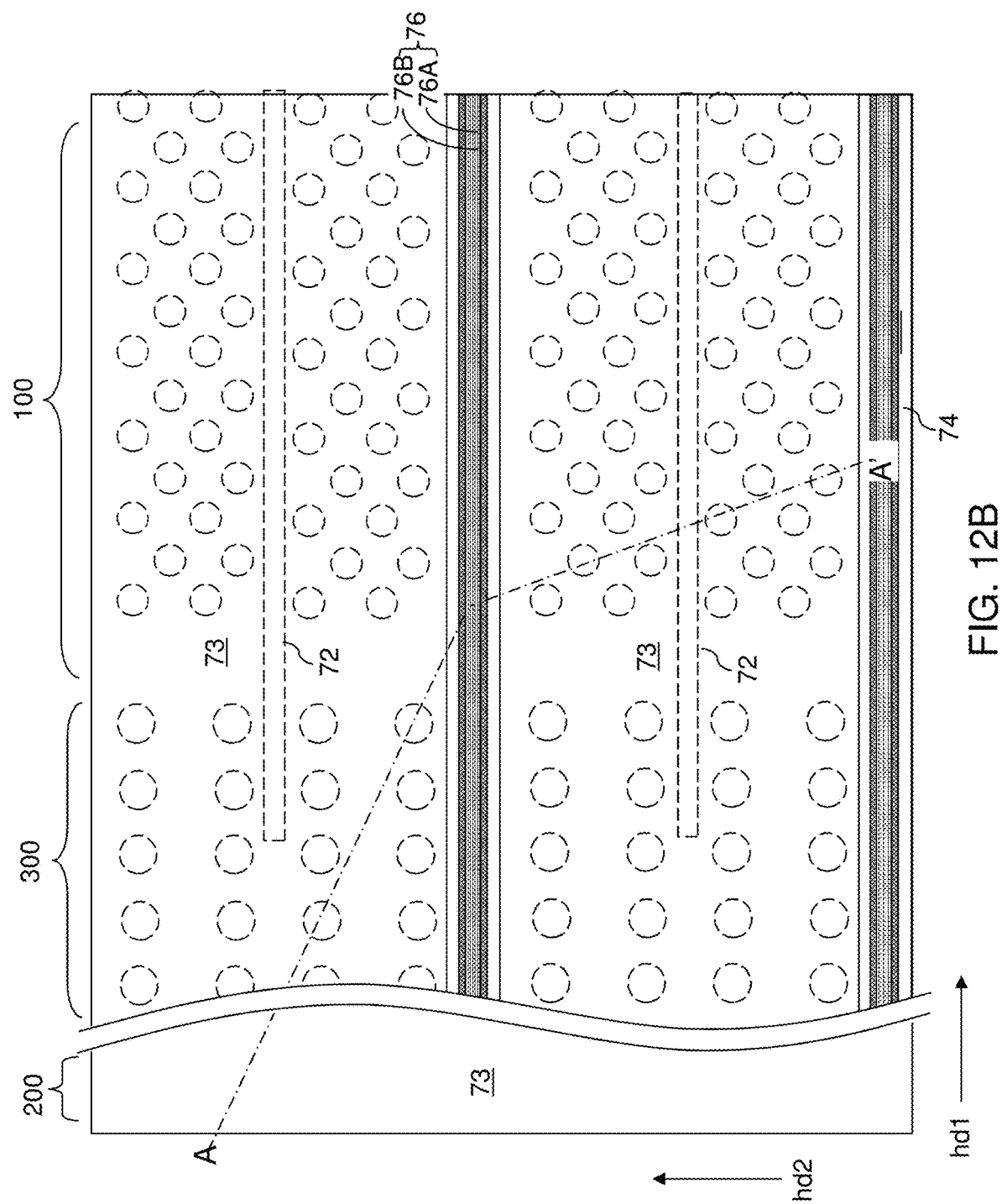
FIG. 12B is a partial see-through top-down view of the exemplary structure of FIG. 12A. The vertical plane A-A' is the plane of the schematic vertical cross-sectional view of FIG. 12A.

Referring to FIGS. 12A and 12B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74.

A top surface of a source region 61 can be physically exposed at the bottom of each backside trench 79. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Referring again to FIGS. 12A and 12B, a backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each backside contact via structure 76 extends through the alternating stacks (32, 46), and contacts a top surface of a respective source region 61. If a backside blocking dielectric layer 44 is employed, each backside contact via structure 76 can contact a sidewall of the backside blocking dielectric layer 44.

Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above-described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 13:
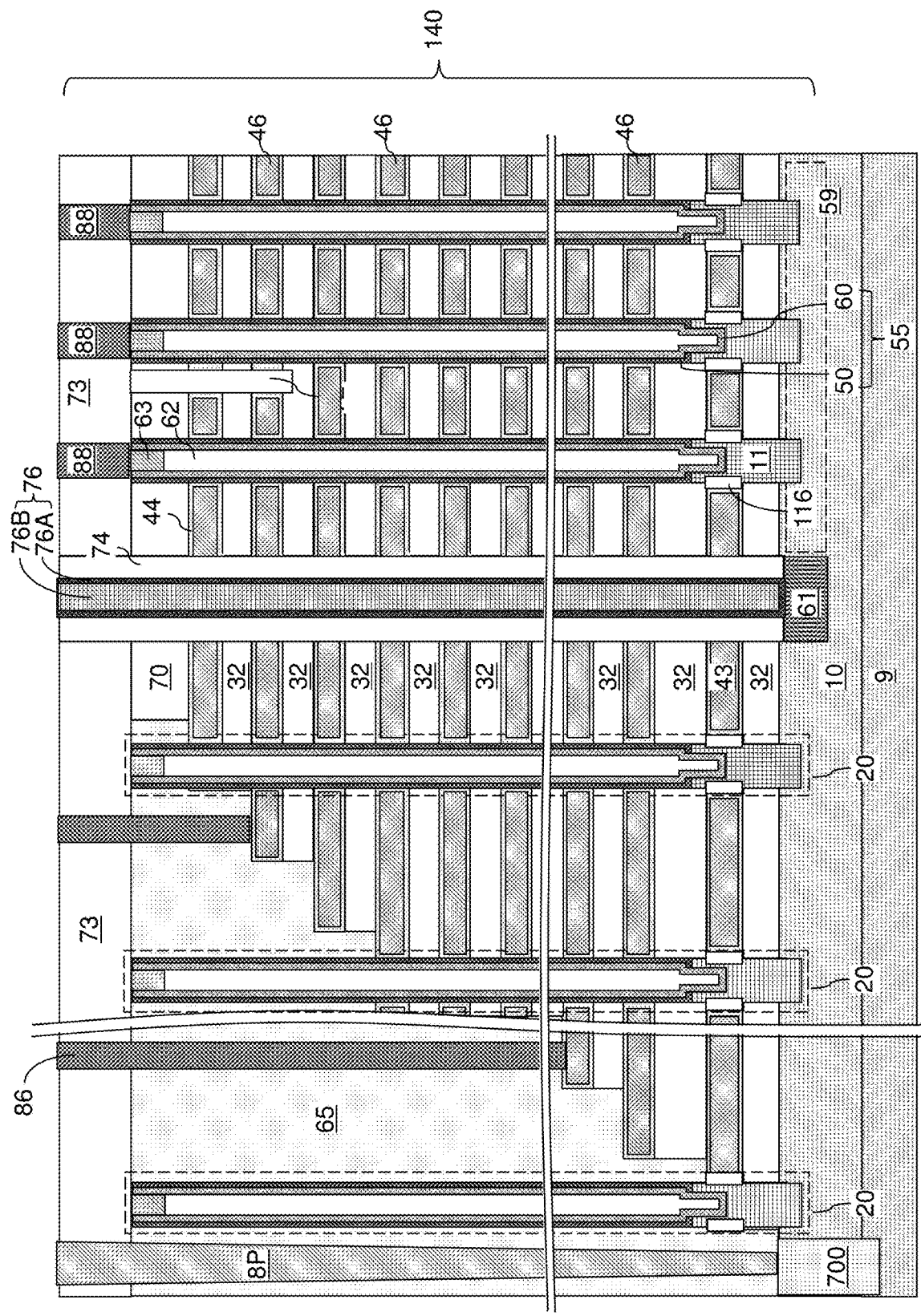
FIG. 13 is a schematic vertical cross-sectional view of the exemplary structure after formation of additional contact via structures according to an embodiment of the present disclosure.

Referring to FIG. 13, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. Bit lines (not shown) are formed in electrical contact with the drain contact via structures 88. This completes the formation of a semiconductor device 140 on the substrate 9.

It may be desirable to inspect semiconductor devices 140, such as three-dimensional NAND memory devices as shown in FIGS. 1-13, at various stages of the fabrication process to ensure that the device has been properly fabricated and does not contain defects that can negatively affect device performance. For example, as part of the semiconductor device fabrication process, the in-process semiconductor device structures, or representative samples thereof, may be subjected to regular testing and/or inspection processes at pre-determined stages of the fabrication process. Semiconductor device structures that are determined to contain excessive defects, or are determined as likely to contain excessive defects, may be removed from the fabrication process for further study and/or root-cause analysis.

It is generally beneficial that the processes used for testing and/or inspection of the semiconductor device structures are not excessively disruptive to the overall semiconductor device fabrication process. In particular, the processes used for testing and/or inspection of the semiconductor device structures should not require an excessively long time to complete the testing and/or inspection (which can slow-down the overall fabrication process). It is also desirable that the testing and/or inspection process be non-destructive, meaning that the testing and/or inspection process itself does not render the semiconductor device structure being examined unusable. Further, the testing and/or inspection process(es) utilized should be able to accurately identify most or all of the types of commonly-occurring defects that can have a significant negative impact on the performance of the semiconductor device.

For three-dimensional NAND memory devices 140, such as shown in FIGS. 1-13, existing testing and inspection processes have not been capable of satisfactorily identifying all types of defects in a non-destructive manner. In particular, certain defects located within the interior of the three-dimensional structure of the NAND memory devices (which may be referred to as "embedded defects") have proven difficult to detect in a non-destructive manner Such embedded defects may include, for example, isolated particular contaminants and/or void areas in critical regions of the structure. In the case of in-process three-dimensional NAND memory devices 140, such critical regions may include, without limitation, the alternating stack of insulating layers 32 and sacrificial material layers 42, the alternating stack of insulating layers 32 and conductive word line layers 46, the backside recesses 43 and the word lines 46 and select gate electrodes formed within the backside recesses 43, the backside trenches 79 and the backside trench via structures 76 and insulating spacers 74 formed within the backside trenches 79, the source region 61 at the bottom of the backside trenches 79, horizontal source line (to be described below) and the memory openings 49 and memory stack structures 55 formed within the memory openings 49. In many cases, the only reliable method to inspect for embedded defects in these regions involves physically cutting into the device to examine it in cross-section, which is an inherently destructive process resulting in material waste and increased costs.

Various embodiments of the present disclosure include systems and methods for non-destructive inspection of semiconductor devices, such as three-dimensional NAND memory device, using reflective X-ray microscope computed tomographic (CT) imaging. Various embodiments may utilize an X-ray microscope to direct a focused beam of X-ray radiation at an oblique angle onto the surface of a semiconductor device. The beam of X-ray radiation may pass through device structures of the semiconductor device and at least a portion of the beam may be reflected by a semiconductor substrate of the semiconductor device. The reflected beam of X-ray radiation may pass through additional device structures of the semiconductor device before being detected by an X-ray detector. The semiconductor device may be rotated about a rotation axis to obtain X-ray images of a region-of-interest (ROI) of the semiconductor device at different projection angles. A processing unit coupled to the X-ray detector may use detected X-ray attenuation data obtained by the X-ray detector at the different projection angles to generate a computed tomography (CT) reconstructed image of the ROI of the semiconductor device. The CT reconstructed image may enable visualization and evaluation of internal structural features of the semiconductor device, as well as identification of embedded defects within the semiconductor device, in a non-destructive manner.

Figure 14A:
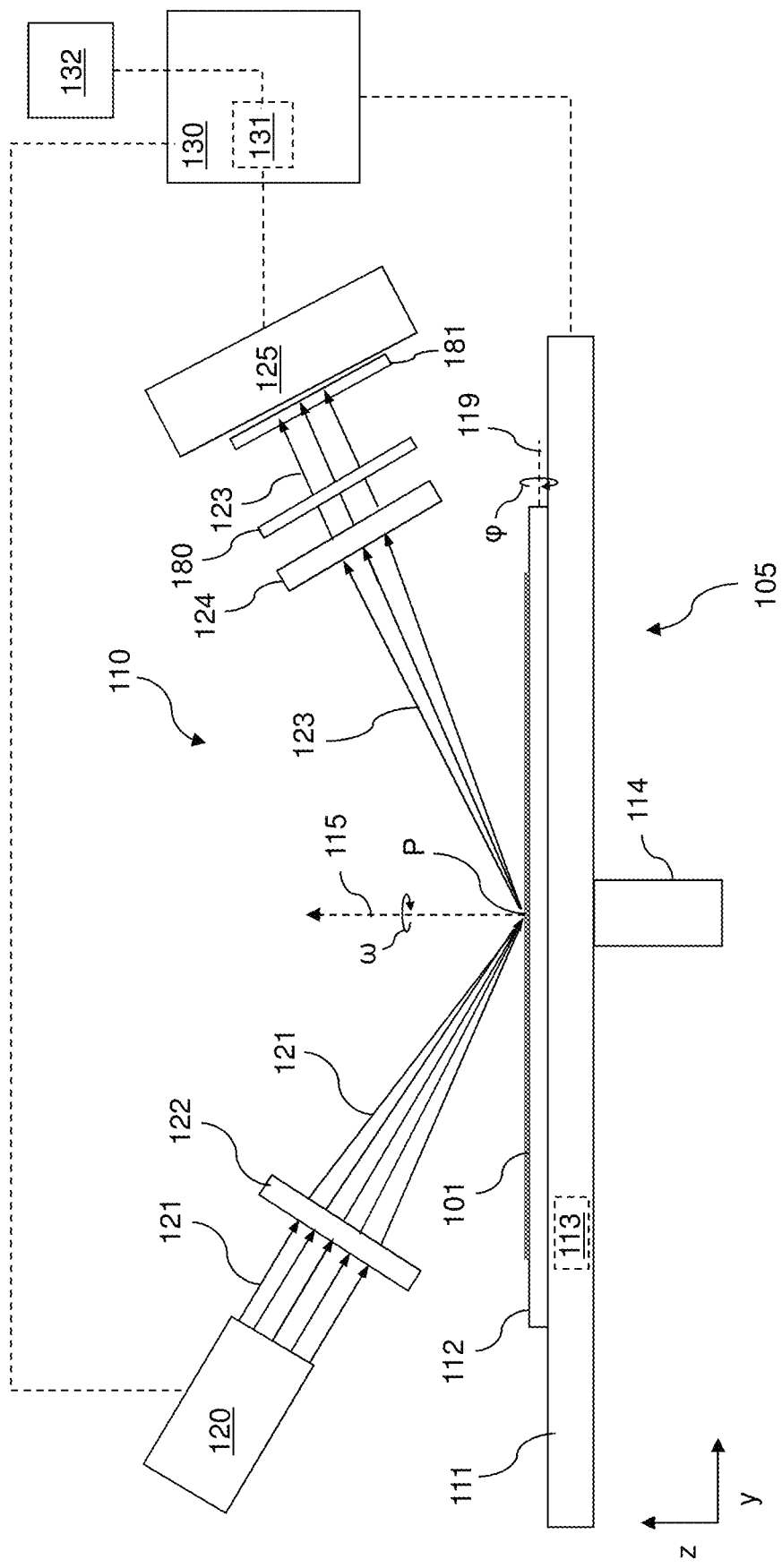
FIG. 14A is a schematic side view of a system for inspecting a semiconductor device according to various embodiments of the present disclosure.
Figure 14B:
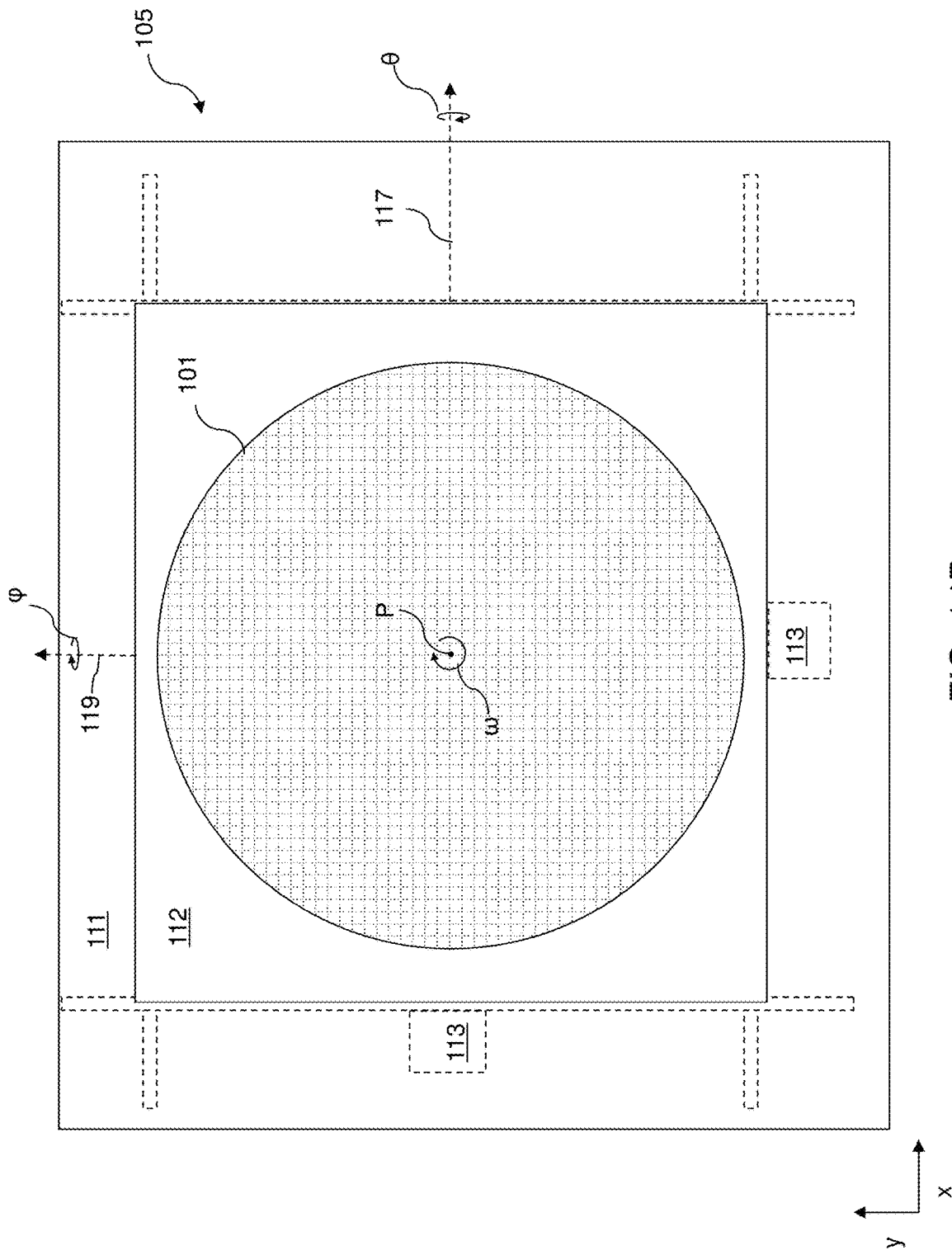
FIG. 14B is a top view of a wafer stage apparatus of the system of FIG. 14A according to various embodiments of the present disclosure.

FIG. 14A is a schematic side view of a system 110 for inspecting a completed or in-process semiconductor device according to various embodiments of the present disclosure. The system 110 includes a wafer stage apparatus 105 that includes a support structure 111 and a platform 112 that is movable with respect to the support structure 111. FIG. 14B is a top view of the wafer stage apparatus 105 schematically illustrating the support structure 111 and the platform 112. A semiconductor wafer 101 may be disposed on the platform 112. The semiconductor wafer 101 may include a semiconductor substrate (such as substrate 9 described above) and a plurality of device structures formed over the semiconductor substrate. In some embodiments, the device structures may include structures formed during a fabrication process of three-dimensional NAND memory device 140, including any of the structures shown and described above with reference to FIGS. 1-13. The semiconductor wafer 101 may include multiple instances of the structures shown in FIGS. 1-13 located in different regions of the wafer 101.

Referring to FIGS. 14A-14B, the wafer stage apparatus 105 may include one or more translation mechanisms 113, such as motor-driven linear actuators, configured to translate the platform 112 and the semiconductor wafer 101 disposed thereon along at least two orthogonal directions (i.e., along the x- and y-axes in FIGS. 14A and 14B) relative to the support structure 111. In some embodiments, the one or more translation mechanisms 113 may also move the platform 112 and the semiconductor wafer 101 along a third orthogonal direction (i.e., along the z-axis in FIGS. 14A and 14B).

The wafer stage apparatus 105 may also include a motor-driven rotary actuator 114 configured to rotate the platform 112 and the semiconductor wafer 101 about an axis 115 that is parallel to the third direction (i.e., the z-axis in FIGS. 14A and 14B). The location of axis 115 may be fixed with respect to the support structure 111. Thus, as the platform 112 and the semiconductor wafer 101 translate with respect to the support structure 111, the semiconductor wafer 101 may be rotated about different points, P, on the semiconductor wafer 101. In some embodiments, one or more additional rotary actuators, such as positioning goniometers, may be configured to tilt the platform 112 and the semiconductor wafer 101 about an axis 117 that is parallel to the first (i.e., x-axis) direction and/or about an axis 119 that is parallel to the second (i.e., y-axis) direction.

A system controller 130 coupled to the wafer stage apparatus 105 may control the precise linear (i.e., x, y and/or x) and rotational (i.e., ω, θ, and/or φ) positions of the platform 112 and the semiconductor wafer 101 with respect to the support structure 111.

The system 110 further includes an X-ray microscope. The X-ray microscope includes an X-ray source 120 configured to direct a beam 121 of X-ray radiation towards a semiconductor wafer 101 disposed on the platform 112 of the wafer stage apparatus 105. The X-ray beam 121 may be highly parallel and monochromatic (i.e., having a large portion of the X-rays, such as ≥75%, including ≥90% or ≥95% of the X-rays within a narrow band (e.g., ±2 keV) of photon energies). In some embodiments, the X-ray energy of the beam 121 may be between 0.5 keV and 30 keV, such as between about 4 keV and about 25 keV. In some embodiments, the X-ray source 120 may be a synchrotron radiation source, such as a bending magnet synchrotron radiation source. It will be understood that other X-ray sources, such as microtron and X-ray tube sources, which may also include a monochromator, may also be utilized.

A first Fresnel zone plate (FZP) 122 may be located in the output path of the X-ray beam 121 between the X-ray source 120 and the semiconductor wafer 101. The first FZP 122 may include a plurality of concentric rings (or zones) which alternate between X-ray radiopaque and X-ray radiolucent materials. The first FZP 122 may be configured to focus the X-ray beam 121 via constructive interference of diffracted X-rays. The X-ray source 120 and the first FZP 122 may be arranged such that the X-ray beam 121 is focused towards point P on the semiconductor wafer 101.

As shown in FIGS. 14A and 14B, the incident X-ray beam 121 may be directed at an oblique angle with respect to both the surface of the semiconductor wafer 101 and the axis 115 about which the semiconductor wafer 101 may be rotated. In some embodiments, the angle between the incident X-ray beam 121 and a planar major (i.e., upper and/or lower) surface of the semiconductor wafer 101 may be 45° or less, such as 30° or less (e.g., between 0.5° and 30°). The incident X-ray beam 121 may pass through a portion of the device structures formed over the semiconductor substrate. At least a portion of the X-rays may be reflected by a reflection plane of the semiconductor material of the semiconductor substrate. For example, for a single crystal silicon substrate, the X-rays may be reflected (e.g., via Bragg reflection) by the 400 or 111 reflection planes. In some embodiments, the reflection plane may be parallel to a planar major (i.e., upper and/or lower) surface of the semiconductor wafer 101. The reflected X-ray beam 123 from the semiconductor substrate may pass through additional device structures before exiting the semiconductor wafer 101.

A second Fresnel zone plate (FZP) 124 may be disposed in the path of the reflected X-ray beam 123. The second FZP 124 may be configured to focus the reflected X-ray beam 123 from a diverging X-ray beam to a parallel X-ray beam. After passing through the second FZP 124, the reflected X-ray beam 123 may be detected by an X-ray detector 125 which may acquire X-ray attenuation data from the detected X-ray beam 123. In some embodiments, the X-ray detector 125 may be a charged coupled device (CCD) detector array, although other suitable X-ray detectors 125 may also be utilized.

In various embodiments, the system 110 may be used for reflective X-ray microscope computed tomography (CT) imaging of the semiconductor wafer 101. In particular, the control system 130 may coordinate the operation of the X-ray microscope with the rotation of the semiconductor wafer 101 about axis 115. As the semiconductor wafer 101 is rotated to different rotation angles, ω, the X-ray detector 125 may acquire multiple projections or "views" of the attenuated X-ray beam as the X-ray beam passes through different portions of the semiconductor wafer 101 within a region-of-interest (ROI) surrounding point P on the semiconductor wafer 101. The X-ray attenuation data acquired by the detector 125 at each angle, ω, may be provided to a processing unit 131 (e.g., a computer). In some embodiments, the processing unit 131 and the control system 130 may be combined in a single computer. Alternatively, the processing unit 131 and the control system 130 may be separate systems that may communicate with one another over a network connection. The processing unit 131 may computationally generate a reconstructed image of the ROI of the semiconductor wafer 101 using a suitable reconstruction algorithm, such as a back projection-based algorithm. The reconstructed image of the ROI of the semiconductor wafer 101 may be shown on a suitable display 132, e.g., as a three-dimensional rendering of all or a portion of the ROI of the semiconductor wafer 101 and/or as two-dimensional cross-sectional image(s) of the ROI of the semiconductor wafer 101.

In some embodiments, the system 100 may be used for phase-contrast CT imaging. Phase-contrast CT imaging may enable the acquisition of high contrast images of composite materials having low X-ray attenuation contrast. In various embodiments, one or more transmission gratings 180, 181 may be disposed in the path of the reflected X-ray beam 123 between the second FZP 124 and the X-ray detector 125. A first grating 180 may be a phase grating, and a second grating 181 may be an amplitude grating. The reflected X-ray beam 123 may pass through the first grating 180 and then through the second grating 181 before being detected by the X-ray detector 125. The gratings 180, 181 may enable the X-ray detector 125 to detect the X-ray phase contrast of the reflected X-ray beam 123. The processing unit 131 may be configured to utilize the measured X-ray phase-contrast data to reconstruct a three-dimensional image of the ROI of the semiconductor wafer 101. In some embodiments, reconstructing the three-dimensional image may include mapping the refractive index of the ROI from the images obtained in plural projection angles, ω, using an X-ray phase tomography technique.

In some embodiments, the control system 130 may control the wafer stage apparatus 105 to move the platform 112 and the semiconductor wafer 101 such that a second ROI of the semiconductor wafer 101 may surround the rotational axis 115, and the process may be repeated to obtain additional CT images of the second ROI. This process may be repeated to obtain three-dimensional CT scans at a plurality of different locations on the wafer, including over the entire wafer 101.

Figure 15:
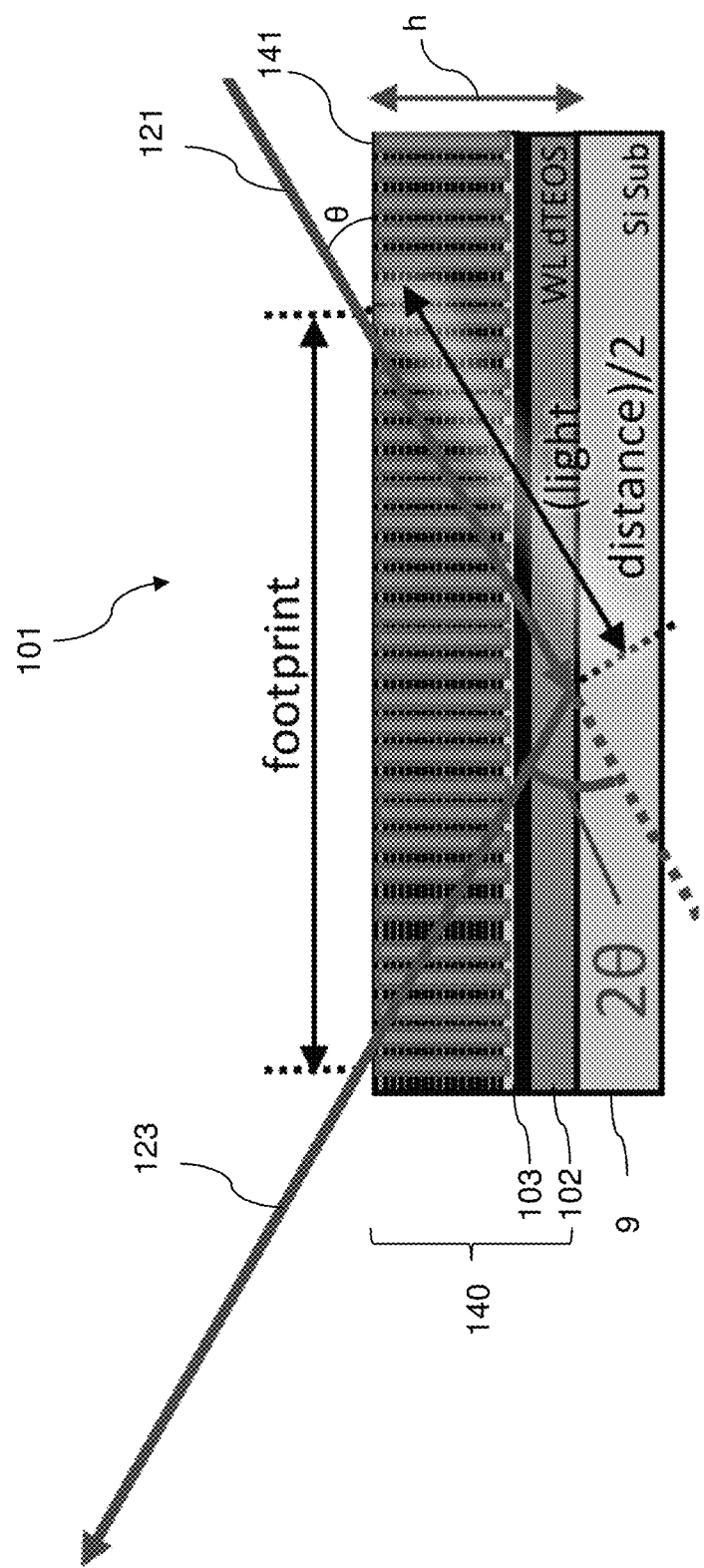
FIG. 15 is a schematic vertical cross-section view of a portion of a semiconductor wafer including device structures formed over a semiconductor substrate during a reflective X-ray microscope CT imaging scan according to an embodiment of the present disclosure.

FIG. 15 is a schematic vertical cross-section view of a semiconductor wafer 101 including device structures 140 formed over a semiconductor substrate 9 during a reflective X-ray microscope CT imaging scan. In this embodiment, the device structures 140 may include three-dimensional NAND memory device structures as described above with reference to FIGS. 1-13. As discussed above, in one embodiment, an additional insulating layer 102 may be formed over the silicon substrate 9. The insulating layer 102 may comprise a silicon oxide layer formed by CVD from a TEOS source. A horizontal source line 103, such as a heavily doped polysilicon source line is formed over the insulating layer 102. The horizontal source line 103 contacts sidewalls of the vertical semiconductor channels 60 and may be formed by replacement of a sacrificial material layer and etching of the memory film 50 through a backside recess 43 and the backside trench 79, followed by deposition of the horizontal source line 103 in the backside recess 43 through the backside trench 79.

As discussed above, various embodiments utilize a reflective imaging configuration in which the X-ray source 120 and the X-ray detector 125 are both located on the same side of the object being imaged, and the X-ray detector 125 detects X-ray beams that are reflected from a surface of the object being imaged. This is in contrast to a transmissive configuration in which the X-ray source and X-ray detector are located on opposite sides of the object being imaged, and the X-ray detector detects X-ray beams that have passed completely through the object. An advantage of a reflective imaging configuration for inspection of semiconductor devices in accordance with various embodiments is that the X-ray penetration length through the semiconductor wafer 101 may remain substantially constant throughout the entire imaging scan. This is schematically illustrated in FIG. 15, which shows the path of the incident 121 and reflected 123 X-ray beams through the device structures 140. In this example, the reflection plane of the X-ray beam is the (111) crystal plane of silicon, which is parallel to the planar upper surface 141 of the wafer 101. The total X-ray penetration length is thus a function of the incident angle θ of the X-ray beam 121 and the height h of the upper surface 141 of the wafer 101 relative to the surface of the substrate 9. In particular, the X-ray penetration length (PL) is equal to $2\{h/\sin[\pi-2\theta)/2]\}$, and is uniform over the entire wafer 101 in cases where h and θ are constant. This may facilitate CT imaging of the wafer 101 because the uniform X-ray penetration length means that the background X-ray attenuation stays relatively constant as the wafer 101 rotates with respect to the X-ray source 120 and detector 125, and the detected X-ray attenuation does not vary widely between regions of high and low attenuation as is the case in many transmissive-type CT imaging scans. The "footprint" in FIG. 15 represents the portion of the semiconductor wafer 101 that may be imaged during a single CT scan (e.g., a single rotation of the wafer 101 about its rotation axis 115), and is a function of the incident angle θ of the X-ray beam 121 and the penetration length PL through the semiconductor wafer 101, where the width of the footprint is equal to $PL*\cos(\theta)$.

In addition, by utilizing a reflective imaging configuration as opposed to a transmissive configuration, sufficient X-ray intensity may be received at the X-ray detector 125 (e.g., via Bragg reflection from the semiconductor material substrate 9) without requiring thinning of the semiconductor material substrate 9 to enable X-rays to pass through the wafer 101, which is typically a destructive process.

Figure 16:
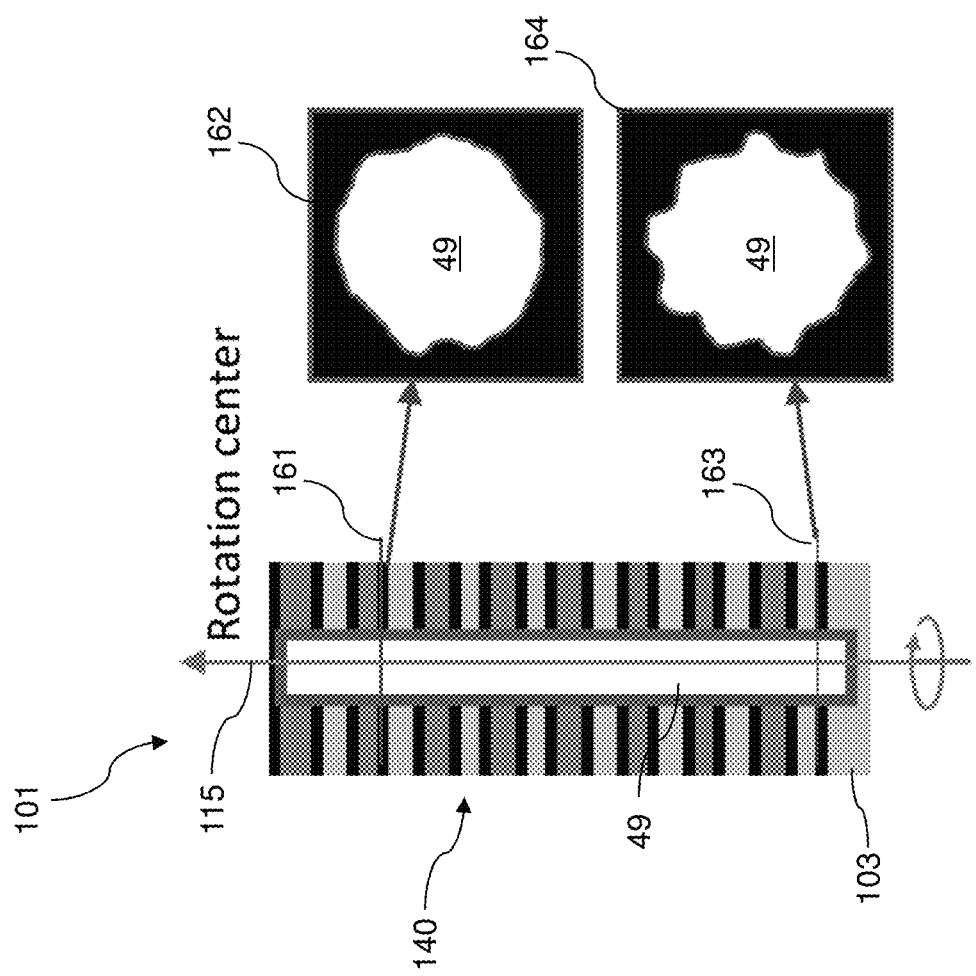
FIG. 16 is a schematic vertical cross section view of a portion of a semiconductor wafer including three-dimensional NAND memory device structures and two-dimensional cross-sectional images of a device structure obtained using reflective X-ray microscope CT imaging according to an embodiment of the present disclosure.

A system 110 as described above may be used to visualize and evaluate internal structures within the semiconductor wafer 101. FIG. 16 illustrates a portion of a semiconductor wafer 101 that includes three-dimensional NAND memory device structures 140. In this embodiment, the system 110 is used to obtain CT images of a region of the semiconductor wafer 101 that includes a memory opening 49. The wafer 101 may be positioned using the wafer stage apparatus 105 such that the rotational axis 115 of the wafer 101 may correspond to the location of the memory opening 49. Reflective X-ray microscope CT images of the wafer 101 may be obtained as described above. FIG. 16 illustrates a first two-dimensional cross-sectional image 162 of the memory opening 49 along a first cross-sectional plane 161, and a second two-dimensional cross-sectional image 164 of the memory opening 49 along a second cross-sectional plane 163. A system 110 as described above may enable visualization and evaluation of numerous structural features within the semiconductor wafer 101, including the profile, striation and/or circularity of memory openings 49 as shown in FIG. 16. Other internal structural features that may be inspected include bending and/or tilting of trench structures (e.g., backside trenches 70), as well as the shapes of various interconnect features, such as metal lines and vias.

Figure 17:
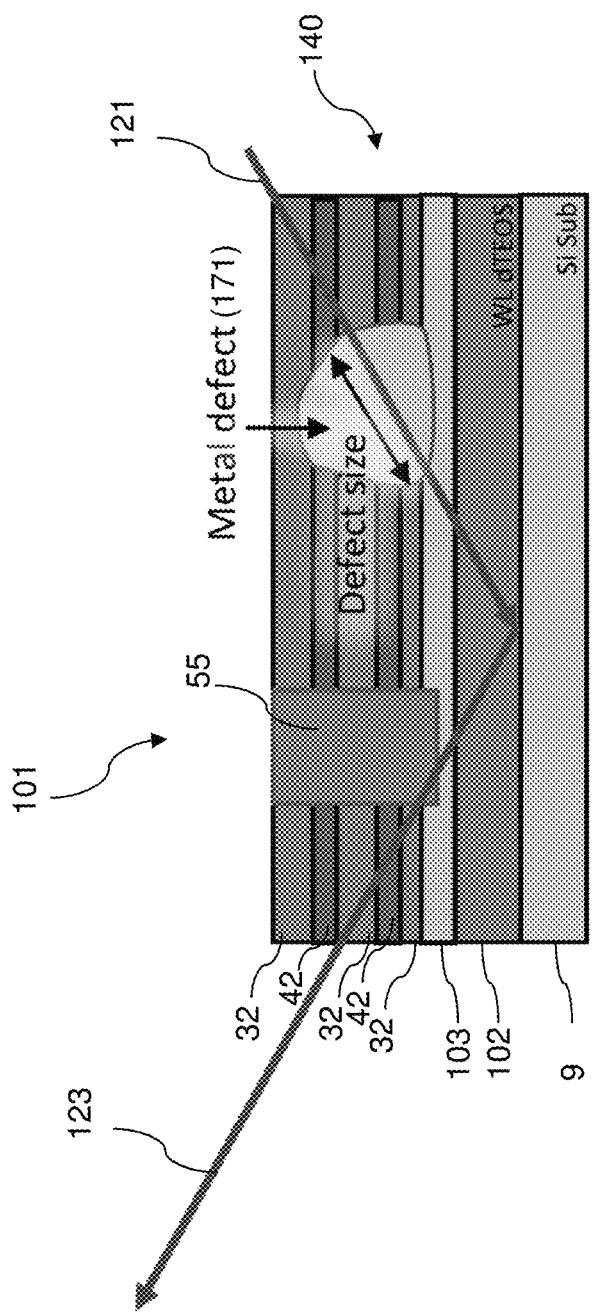
FIG. 17 is a schematic vertical cross-section view of a portion of a semiconductor wafer including an alternating stack of insulating layers and sacrificial material layers and an embedded defect within the alternating stack during a reflective X-ray microscope CT imaging scan according to an embodiment of the present disclosure.

A system 110 as described above may be used to identify embedded defects within the semiconductor wafer 101. FIG. 17 illustrates a portion of a semiconductor wafer 101 that includes three-dimensional NAND memory device structures 140. In this embodiment, the system 110 is used to obtain CT images of an alternating stack of insulating layers 32 and sacrificial material layers 42, such as described above with reference to FIG. 2. The CT images may enable visualization and identification of an embedded defect, such as an isolated metal particle 171 within the alternating stack, as shown in FIG. 2. The various embodiments may enable identification of embedded defects, including embedded defects within a nanometer range (e.g., having at least one dimension between 1 nm and 1 μm), using a non-destructive reflective X-ray microscope CT inspection technique. The embedded defects may include isolated particles such as shown in FIG. 17, as well as undesired void areas within the device structures 140 of the semiconductor wafer 101.

A relatively high contrast in X-ray attenuation characteristics between different materials, such as dielectric materials (e.g., SiN, $SiO_2$, etc.) and metals (e.g., W, Cu, Al, Mo, etc.) may facilitate identification of embedded defects, such as the metal defect 171 located in a dielectric material layer stack 32, 42 as shown in FIG. 17. In general, higher contrast images may be obtained using relatively low X-ray energies (e.g., 0.5-5 keV, such as ~4 keV). At low energies, however, the transmitted X-ray intensity is also low. This may be compensated for by using increased exposure times.

Figure 18:
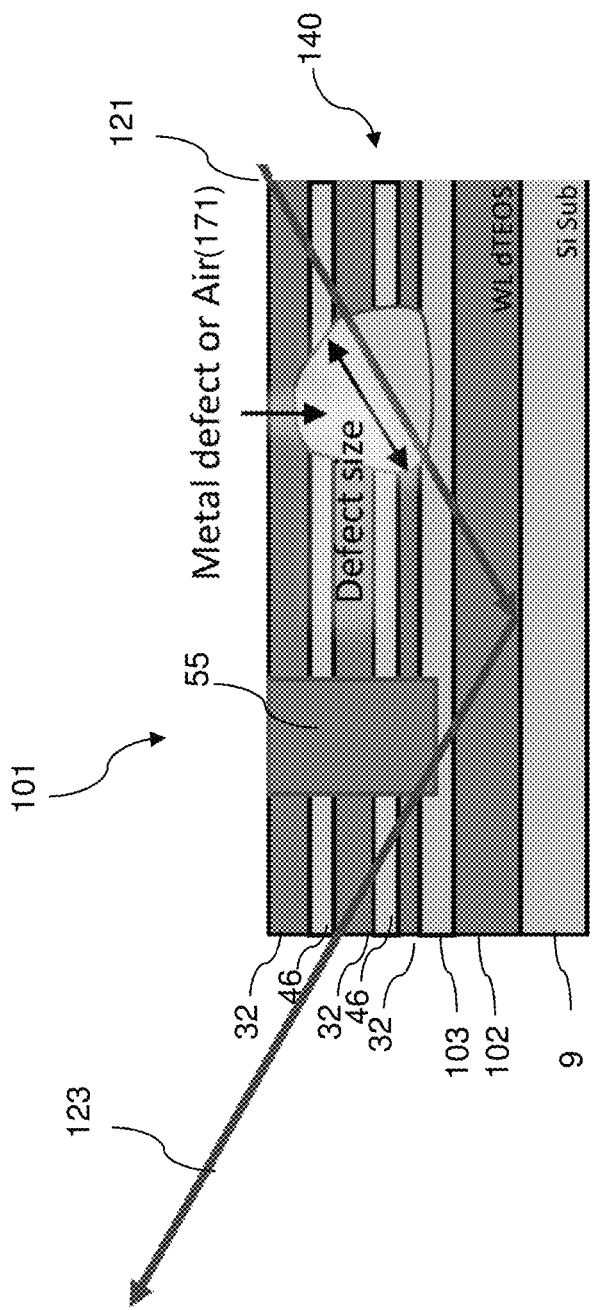
FIG. 18 is a schematic vertical cross-section view of a portion of a semiconductor wafer including an alternating stack of insulating layers and conductive word line layers and an embedded defect within the alternating stack during a reflective X-ray microscope CT imaging scan according to an embodiment of the present disclosure.

In some embodiments, different X-ray energies may be used for inspection of different device structures 140. The different device structures 140 may be located on different regions of the same semiconductor wafer 101, or may be located in the same region of the semiconductor wafer 101, but during different stages of the device fabrication process. FIG. 18 illustrates a portion of the semiconductor wafer 101 of shown in FIG. 17 following the replacement of the sacrificial material layers 42 of the alternating stack with electrically conductive (i.e., metal) word line layers 46, as described above with reference to FIGS. 8-11B. The embedded defect 171 may be a metal particle or a void area (i.e., air). The presence of the metal word line layers 46 may significantly decrease the overall transmitted X-ray intensity through the device structures 140. Thus, to provide adequate X-ray intensity for imaging, a higher X-ray energy may be utilized. However, X-ray energies just above an L-edge absorption energy of the metal used for the word line layers 46 should be avoided. Tungsten, for example, includes L-edge absorption peaks at 10.2 keV, 11.5 keV and 12.1 keV, meaning that at X-ray energies above 10.2 keV, both total X-ray intensity and contrast rapidly decrease. Thus, X-ray energies up to ~10 keV may be utilized in this example, which may provide relatively high overall transmitted X-ray intensity with adequate contrast.

Referring to all drawings and according to various embodiments of the present disclosure, a system 110 for non-destructive inspection of semiconductor devices includes an X-ray source 120 configured to direct a beam of X-ray radiation 121 at an oblique angle onto a surface of a semiconductor wafer 101 such that the beam of X-ray radiation passes 121 through device structures 140 located over a semiconductor substrate 9 of the semiconductor wafer 101, and at least a portion of the beam of X-ray radiation is reflected by the semiconductor substrate 9 of the semiconductor wafer 101, an X-ray detector 125 configured to detect X-ray radiation 123 that is attenuated by the device structures 104 and reflected by the semiconductor substrate 9 of the semiconductor wafer 101, a wafer stage apparatus 105 configured to rotate the semiconductor wafer 101 with respect to a rotation axis 115 such that the X-ray detector 125 detects X-ray radiation 123 that is attenuated by the device structures 140 and reflected by the semiconductor substrate 9 of the semiconductor wafer 101 over a plurality of different projection angles, and a processing unit 131 coupled to the X-ray detector 125 and configured to receive X-ray image data from the X-ray detector 125 for each projection angle of the plurality of different projection angles and to generate a reconstructed image of the device structures 140 of the semiconductor wafer 101.

In one embodiment, a first Fresnel zone plate 122 is located in a path of the beam of X-ray radiation 121 between the X-ray source 120 and the surface of the semiconductor wafer 101 and is configured to focus the beam of X-ray radiation 121 onto the surface of the semiconductor wafer 101.

In one embodiment, a second Fresnel zone plate 124 is located in a path of the X-ray radiation 123 that is reflected by the semiconductor substrate 9 and is configured to focus the X-ray radiation 123 that is reflected by the semiconductor substrate 9 onto the X-ray detector 125.

In one embodiment, the wafer stage apparatus 105 is further configured to translate the semiconductor wafer 101 along at least two orthogonal directions with respect to the X-ray source 120 and the X-ray detector 125.

In one embodiment, the wafer stage apparatus 105 is configured to translate the semiconductor wafer 101 along a first direction and a second direction that is orthogonal to the first direction, and both the first direction and the second direction are orthogonal to the rotation axis 115.

In one embodiment, the wafer stage apparatus 105 is configured to translate the semiconductor wafer 101 along the first direction and the second direction with respect to the rotation axis 115 such that the semiconductor wafer 101 is rotatable about different locations on the semiconductor wafer 101.

In one embodiment, the wafer stage apparatus 105 is configured to tilt the semiconductor about at least one tilt axis (117, 119), where the at least one tilt axis (117, 119) is orthogonal to the rotation axis 115.

In one embodiment, an energy of the X-ray radiation beam 121 from the X-ray source 120 is ≥4 keV and ≤25 keV.

In one embodiment, the X-ray radiation beam 121 is monochromatic.

In one embodiment, the angle of the X-ray radiation beam 121 incident on the semiconductor wafer 101 is 45° or less with respect to a planar major surface 141 of the semiconductor wafer 101.

The various embodiments of the present disclosure may be employed to non-destructively inspect semiconductor device structures using reflective X-ray microscope computed tomography (CT) imaging. In one embodiment, a semiconductor wafer 101 including a semiconductor material substrate 9 and device structures 140 over the semiconductor material substrate 9 may be provided. A beam of X-ray radiation 121 may be directed at an oblique angle onto a surface of the semiconductor wafer 101 such that the beam of X-ray radiation 121 passes through the device structures 140, and at least a portion of the beam of X-ray radiation is reflected by the semiconductor substrate 9 of the semiconductor wafer 9. X-ray radiation 123 that is attenuated by the device structures 140 and reflected by the semiconductor substrate 9 of the semiconductor wafer 9 may be detected by an X-ray detector 125. The semiconductor wafer 101 may be rotated with respect to the beam of X-ray radiation 121 such that the X-ray detector 125 detects X-ray radiation 123 that is attenuated by the device structures 140 and reflected by the semiconductor substrate of the semiconductor wafer at a plurality of different projection angles. A reconstructed image of the device structures 140 may be generated using image data from the X-ray detector 125 obtained at each projection angle of the plurality of different projection angles.

In one embodiment, the reconstructed image of the device structures 140 may be displayed on a display device 132, and at least one embedded defect 171 in the device structures 140 may be identified from the displayed reconstructed image.

In one embodiment, the at least one embedded defect 171 may include one or more of an isolated particle and a void area within the device structures 140.

In one embodiment, a phase-contrast of the X-ray radiation that is attenuated by the device structures and reflected by the semiconductor substrate of the semiconductor wafer may be used to generate the reconstructed image of the device structures 140.

In one embodiment, the device structures 140 may include device structures 140 formed over the semiconductor material substrate 9 during a process of fabricating a semiconductor device.

In one embodiment, the device structures 140 may include device structures formed over the semiconductor material substrate 9 during a process of forming a three-dimensional NAND memory device, and may include at least one of an alternating stack of insulating layers 32 and sacrificial material layers 42, an alternating stack of insulating layers 32 and conductive word line layers 46, a backside recess 43, a word line 46 and/or a select gate electrode formed within a backside recess 43, a backside trench 79, a backside trench via structure 76 and/or an insulating spacer 74 formed within a backside trench 79, a source region 61 located at least partially below a backside trench 79, a memory opening 49, and a memory stack structure 55 formed within a memory opening 49.

In one embodiment, an energy of the X-ray radiation beam 121 directed onto the semiconductor wafer 101 is ≥4 keV and ≤25 keV.

In one embodiment, the energy of the X-ray radiation beam 121 is varied based on a stage of the fabrication process of the semiconductor device.

In one embodiment, the fabrication process of the semiconductor device includes a process of replacing sacrificial material layers 42 of an alternating stack of insulating layers 32 and sacrificial material layers 42 with conductive word line layers 46 to provide an alternating stack of insulating layers 32 and conductive word line layers 46, and the energy of the beam of X-ray radiation 121 used to generate a reconstructed image of the device structures 140 prior to replacement of the sacrificial material layers 42 with the conductive word line layers 46 is less than the energy of the beam of X-ray radiation 121 used to generate a reconstructed image of the device structures 140 after replacement of the sacrificial material layers 42 with the conductive word line layers 46.

In one embodiment, the conductive word line layers 46 include a metal material, and the energy of the beam of X-ray radiation 121 used to generate a reconstructed image of the device structures 140 after replacement of the sacrificial material layers 42 with the conductive word line layers 46 is less than an L-edge energy of the metal material of the conductive word line layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of non-destructive inspection of semiconductor device structures, comprising:

providing a semiconductor wafer comprising a semiconductor material substrate and device structures over the semiconductor material substrate;

directing a beam of X-ray radiation at an oblique angle onto a surface of the semiconductor wafer such that the beam of X-ray radiation passes through the device structures, and at least a portion of the beam of X-ray radiation is reflected by the semiconductor substrate of the semiconductor wafer;

detecting X-ray radiation that is attenuated by the device structures and reflected by the semiconductor substrate of the semiconductor wafer;

rotating the semiconductor wafer with respect to the beam of X-ray radiation such that the X-ray detector detects X-ray radiation that is attenuated by the device structures and reflected by the semiconductor substrate of the semiconductor wafer at a plurality of different projection angles; and generating a reconstructed image of the device structures using image data from the X-ray detector obtained at each projection angle of the plurality of different projection angles;

wherein a phase-contrast of the X-ray radiation that is attenuated by the device structures and reflected by the semiconductor substrate of the semiconductor wafer is used to generate the reconstructed image of the device structures;

wherein an energy of the X-ray radiation beam directed onto the semiconductor wafer is ≥4 keV and ≤25 keV;

wherein the energy of the X-ray radiation beam is varied based on a stage of the fabrication process of the semiconductor device; and wherein the fabrication process of the semiconductor device includes a process of replacing sacrificial material layers of an alternating stack of insulating layers and sacrificial material layers with conductive word line layers to provide an alternating stack of insulating layers and conductive word line layers, and the energy of the beam of X-ray radiation used to generate a reconstructed image of the device structures prior to replacement of the sacrificial material layers with the conductive word line layers is less than the energy of the beam of X-ray radiation used to generate a reconstructed image of the device structures after replacement of the sacrificial material layers with the conductive word line layers.

2. The method of claim 1, wherein the conductive word line layers comprise a metal material, and the energy of the beam of X-ray radiation used to generate a reconstructed image of the device structures after replacement of the sacrificial material layers with the conductive word line layers is less than an L-edge energy of the metal material of the conductive word line layers.

* * * * *